US010090507B2

(12) United States Patent
Tsunokuni et al.

(10) Patent No.: US 10,090,507 B2
(45) Date of Patent: Oct. 2, 2018

(54) SECONDARY BATTERY-MOUNTED CIRCUIT CHIP AND MANUFACTURING METHOD THEREOF

(71) Applicants: KABUSHIKI KAISHA NIHON MICRONICS, Musashino-shi, Tokyo (JP); GUALA TECHNOLOGY CO., LTD., Kobe-shi, Hyogo (JP)

(72) Inventors: Kazuyuki Tsunokuni, Musashino (JP); Tatsuo Inoue, Musashino (JP); Kiyoyasu Hiwada, Musashino (JP); Takashi Tonokawa, Musashino (JP); Akira Nakazawa, Kobe (JP)

(73) Assignees: KABUSHIKI KAISHA NIHON MICRONICS, Tokyo (JP); GUALA TECHNOLOGY CO., LTD., Kobe (JP)

( * ) Notice: Subject to any disclaimer, the term of this patent is extended or adjusted under 35 U.S.C. 154(b) by 174 days.

(21) Appl. No.: 14/771,398

(22) PCT Filed: Mar. 5, 2014

(86) PCT No.: PCT/JP2014/055697
§ 371 (c)(1),
(2) Date: Aug. 28, 2015

(87) PCT Pub. No.: WO2015/129051
PCT Pub. Date: Sep. 3, 2015

(65) Prior Publication Data
US 2016/0181588 A1 Jun. 23, 2016

(30) Foreign Application Priority Data
Feb. 25, 2014 (JP) .................................. 2014-033854

(51) Int. Cl.
*H01M 4/00* (2006.01)
*H01M 2/34* (2006.01)
(Continued)

(52) U.S. Cl.
CPC ....... *H01M 2/345* (2013.01); *H01M 10/0436* (2013.01); *H01M 10/0463* (2013.01);
(Continued)

(58) Field of Classification Search
CPC ...................................................... H01M 4/00
See application file for complete search history.

(56) References Cited

U.S. PATENT DOCUMENTS

2003/0152815 A1* 8/2003 LaFollette ........... H01M 2/0202
429/7
2008/0280206 A1* 11/2008 Oukassi .................. H01M 2/10
429/231.5
(Continued)

FOREIGN PATENT DOCUMENTS

JP 2004-281593 A 10/2004
JP 2004-320011 A 11/2004
(Continued)

OTHER PUBLICATIONS

Chen, Gregory et al. "A Cubic-Millimeter Energy-Autonomous Wireless Intraocular Pressure Monitor". ISSCC, 2011/Session 17/Biomedical & Displays/17.6, pp. 18-20.
(Continued)

*Primary Examiner* — Jacob B Marks
(74) *Attorney, Agent, or Firm* — Oliff PLC

(57) ABSTRACT

A secondary battery-mounted circuit chip wherein secondary battery is directly fabricated on opposed surface of formed circuit into an integrated structure of the secondary battery and circuit, and a manufacturing method thereof. Secondary battery-mounted circuit chip is configured such
(Continued)

that secondary battery is directly fabricated in region corresponding to circuit into integrated structure of secondary battery and circuit. The chip is secondary battery-mounted circuit chip wherein secondary battery is formed on surface opposing a circuit region fabricated on wafer. Secondary battery and circuit are formed into integrated structure by forming the uppermost part of circuit having multilayer wiring into secondary battery structure on upper part of circuit surface subjected to passivation, forming secondary battery directly stacked by making uppermost wiring layer of multilayer wiring part of circuit in a surface structure to be used in common, or forming secondary battery on rear surface of substrate having the circuit formed thereon.

15 Claims, 21 Drawing Sheets

(51) Int. Cl.
| | | |
|---|---|---|
| H02S 50/00 | (2014.01) | |
| H01M 10/42 | (2006.01) | |
| H01M 10/04 | (2006.01) | |
| H01M 10/0525 | (2010.01) | |
| H01M 4/04 | (2006.01) | |
| H01M 4/139 | (2010.01) | |
| H01M 4/48 | (2010.01) | |
| H01M 4/66 | (2006.01) | |
| H01M 10/052 | (2010.01) | |
| H01M 10/0585 | (2010.01) | |
| H01M 10/44 | (2006.01) | |
| H01M 6/40 | (2006.01) | |

(52) U.S. Cl.
CPC ..... *H01M 10/0525* (2013.01); *H01M 10/425* (2013.01); *H02S 50/00* (2013.01); *H01L 2224/48247* (2013.01); *H01M 4/0426* (2013.01); *H01M 4/139* (2013.01); *H01M 4/483* (2013.01); *H01M 4/661* (2013.01); *H01M 6/40* (2013.01); *H01M 10/049* (2013.01); *H01M 10/052* (2013.01); *H01M 10/0585* (2013.01); *H01M 10/446* (2013.01); *H01M 2200/20* (2013.01); *H01M 2220/30* (2013.01)

(56) References Cited

U.S. PATENT DOCUMENTS

2011/0123842 A1* 5/2011 Kim .................. H01M 10/0525
429/7
2013/0337291 A1* 12/2013 Mayer .................. H01M 2/202
429/7
2014/0320108 A1* 10/2014 Dewa .................... H01M 10/48
324/72.5

FOREIGN PATENT DOCUMENTS

JP         2007-026982 A      2/2007
WO    WO 2013-065094       *  5/2013

OTHER PUBLICATIONS

Chen, Gregory et al. "Millimeter-Scale Nearly Perpetual Sensr System with Stacked Battery and Solar Cells". IEEE International Solid-State Circuits Conference, Digest of Technical Papers, pp. 288-289, 2010.

* cited by examiner

SECONDARY BATTERY-MOUNTED CIRCUIT CHIP AND MANUFACTURING METHOD THEREOF

TECHNICAL FIELD

The present invention relates to a structure of a secondary battery-mounted circuit chip in which a secondary battery is integrally formed with a circuit fabricated on a silicon substrate or the like, and a manufacturing method thereof.

BACKGROUND ART

As the secondary battery that can charge and hold electricity therein, a lead-acid storage battery, a nickel-cadmium storage battery, a lithium-ion secondary battery and so on have been developed and practically used. Recently, an all-solid secondary battery which can be formed of a thin film is attracting attention and is progressively applied to smaller devices because of its safety and reduction in packaging space.

In Non-Patent Document 1, a secondary battery is mounted in a small device that measures the intraocular pressure being the cause of glaucoma or the like that is a disorder of the eye. To measure the pressure with the small device inserted in the eye, a thin film lithium-ion battery is mounted which can be downsized. FIG. 18 is an IOPM (Intraocular Pressure Monitor) disclosed in Non-Patent Document 1. The IOPM is a device of a micro-size to be inserted into the eyeball, and the thin film lithium-ion secondary battery is used as an integral type power supply. A thin film lithium-ion secondary battery 102 is mounted on the top of a pressure sensor 100, and a microprocessor for control, a circuit part 104 such as a storage element and so on are further mounted. The pressure sensor 10, the thin film lithium-ion secondary battery 102, and the circuit part are made by physically superposing individual discrete components.

In Non-Patent Document 2, a compact sensor has been developed which is used for environmental monitoring and biological monitoring in the medical field and requires no charge or battery change as illustrated in FIG. 19. Sensor units operating for a long period by suppressing power consumption have been conventionally published, but could not be downsized as the whole of the sensor unit because a small size battery is insufficient in power capacity and therefore the size of the battery is an obstacle. Therefore, the power-saving technology has been introduced into the control of the microprocessor and the sensor, and the solar battery and the lithium-ion battery built therein have been downsized by thinning them, thereby developing a compact sensor unit operating for a long period. The external appearance of the sensor unit has a size of 3.5 mm×2.5 mm×1.0 mm and a volume of 8.75 mm³. At the top, four solar battery cells 124 are provided and have a total area of 2 mm². Under the solar battery cells 134, a 32-bit microprocessor 132, a memory, and a thin film lithium-ion secondary battery 130 are stored. The volume of the thin film lithium-ion secondary battery is extremely small such as 2.9 mm³.

The thin film lithium-ion secondary battery 120 embedded in the compact sensor is made by fabricating a plurality of chips on a silicon wafer and cutting them into individual chips. The chip is attached to a tape as it is or packaged for packaging, and packaged on and soldered to a circuit board by a packaging device. The secondary battery which has been made into a chip as described above can be handled as one component.

Patent-Document 1 discloses a semiconductor device in which a solid thin film secondary battery is monolithically embedded by forming the solid thin film secondary battery on a substrate, and a semiconductor device in which an electronic element and the solid thin film secondary battery are monolithically configured in a circuit. The solid thin film secondary battery is an all-solid lithium-ion secondary battery, and is monolithically embedded by forming the solid thin film secondary battery which uses a porous film formed by surface modification of a semiconductor substrate as an anode active material, on the substrate.

As illustrated in FIG. 20, in an IC/LSI chip 116 on a monolithic secondary battery embedded semiconductor substrate, the monolithically formed solid thin film secondary battery is connected to an IC/LSI part by internal connections 112-1, 112-2. On the substrate of the IC/LSI chip 116, a monolithic solid thin film secondary battery group 110-1 for supplying power to a memory circuit part 114 and a monolithic secondary battery group 110-2 for supplying power mainly to a logic circuit part 113 are integrated together with the circuit group. Both of them can be electrically connected by a plurality of respective internal connections. They can also be externally connected, in which case, however, the advantage of the monolithic method is considered to be greatly lost.

Patent Document 2 also discloses a semiconductor element substrate on which the all-solid lithium-ion secondary battery is mounted as the solid battery.

Patent Document 3 discloses a battery-mounted type integrated circuit device in which a semiconductor chip is mounted on a solid battery. The solid battery has a charge element including a cathode, an anode and a solid electrolyte material, and a protective film outside the charge element, in which the protective film is configured in a multilayer structure and at least one layer thereof has a positive potential. Use of the protective film makes it possible to prevent diffusion ions performing charge and discharge, into the integrated circuit so as to inhibit deterioration of characteristics and malfunction of the semiconductor device and thereby take the semiconductor device into a package, so that a battery mounted-type integrated circuit device with reduced packaging area can be provided.

As illustrated in FIG. 21, a silver paste is applied onto a lead frame 120 fabricated for mounting a battery, and a solid battery 122 is heated at 200° C. and placed. A liquid epoxy resin is applied thereon, and a semiconductor chip 124 is placed. The semiconductor chip and the lead frame, and the solid battery 122 and the lead frame 128 are soldered and wired by an insulation-coated gold wire having a diameter of 100 μm, and an epoxy resin 126 is used to seal them.

PRIOR ART DOCUMENT

Patent Document

Patent Document 1: Japanese Laid-open Patent Publication No. 2004-281593
Patent Document 2: Japanese Laid-open Patent Publication No. 2004-320011
Patent Document 3: Japanese Laid-open Patent Publication No. 2007-026982

Non-Patent Document

Non-Patent Document 1: Gregory Chen, Hassan Ghaed, Razi-ul Hague, Michael Wieckowski, Yejoong, Kim, Gyouho Kim, David Fick, Daeyeon Kim, Mingoo Seok, Kensall Wise, David Blaauw, Dennis Sylvester A Cubic-Millimeter Energy-Autonomous Wireless, Intraocular Pressure Monitor ISSCC 2011/SESSION 17/BIOMEDICAL & DISPLAYS/17.6

Non-Patent Document 2: Chen, G., et al., Millimeter-Scale Nearly Perpetual Sensor System with Stacked Battery and Solar Cells, IEEE International Solid-State Circuits Conference Digest of Technical Papers, pp. 288-289, (2010)

DISCLOSURE OF THE INVENTION

Problems to be Solved by the Invention

As described above, various suggestions have been made relating to the technology of mounting the solid thin film secondary battery on the semiconductor substrate, and are roughly classified into a structure in which a solid thin film secondary battery is separately fabricated as a circuit chip and physically mounted on and integrated with a semiconductor substrate, and a structure in which a fabrication region for a solid thin film secondary battery is provided on a semiconductor substrate and the solid thin film secondary battery is fabricated therein.

The solid thin film secondary battery is thinner and smaller than the nickel-cadmium storage battery and the lead-acid storage battery that are the conventional secondary batteries, and therefore can achieve significant space saving of the secondary battery. Further, the solid thin film secondary battery can be made into an extremely small battery such as a micro-battery. Accordingly, it is possible to realize a semiconductor substrate or small device with secondary battery only by integrally mounting the solid thin film secondary battery as a circuit chip. It is also possible to form the secondary battery directly on the circuit.

However, the technology of reducing the size and weight of electronic devices significantly advances as represented by cellular phones in recent years. Therefore, the solid thin film secondary battery itself to be mounted on them needs to further be downsized.

To solve the problem, it is effective to increase the capacity per unit volume of the secondary battery itself.

The following applies to the manufacturing method. Namely, a semiconductor integrated circuit element is called an IC (Integrated Circuit) chip or an integrated circuit chip, and a plurality of semiconductor integrated circuit elements are generally simultaneously formed on a silicon wafer and cut into individual chips by dicing. However, any prior art for the manufacturing method of simultaneously fabricating on the silicon wafer a plurality of semiconductor substrates with solid thin film secondary battery is not found.

Further, a process exerting no influence on the circuit chip is required in order to directly mount the solid thin film secondary battery on the circuit chip, but fabrication of the conventional solid thin film secondary battery requires a process at high temperature or a process of press in many cases. However, these methods are not adaptable in terms of process as the method of directly mounting the solid thin film secondary battery on the circuit chip because the circuit chip is broken.

In consideration of the above, an object of the present invention is to provide a structure relating to a circuit chip in which a solid thin film secondary battery is integrally formed, and a manufacturing method thereof.

Means for Solving the Problems

A secondary battery-mounted circuit chip of the present invention is a secondary battery-mounted circuit chip integrally formed with a circuit, wherein a secondary battery is formed in a region facing the circuit. The circuit has at least a component composed of a logic circuit, a sensor, or MEMS (Micro Electro Mechanical Systems), and is a circuit formed with a functional element such as a memory element or a CPU (Central Processing Unit) each of which a logic circuit composed of an electronic circuit, or MEMS made by adding any of a mechanical component, a sensor, and an actuator to the electronic circuit. There is no particular limitation on the chip substrate of the circuit, and any substrate may be used such as an SiC substrate, a glass substrate, other than the silicon substrate, as long as an active element can be formed thereon.

Another secondary battery-mounted circuit chip of the present invention is a secondary battery-mounted circuit chip wherein a circuit and a secondary battery are integrally structured, and requires no other substrate for fabricating the secondary battery, and therefore increases only by several μm with respect to the thickness of the semiconductor integrated circuit chip (several hundreds μm). Further, only a few circuits for controlling the operation of the secondary battery are added in terms of a planar structure, resulting in that the outer size of the secondary battery-mounted circuit chip rarely increases even with the secondary battery mounted thereon.

As for the secondary battery to be mounted, the uppermost part of the circuit having multilayer wiring is stacked as the secondary battery, or the secondary battery is formed on a rear surface of the circuit. Further, the secondary battery is formed at an uppermost part of the circuit having multilayer wiring and the secondary battery may be formed also on a rear surface of the circuit, or the secondary battery may be formed only on a rear surface of the circuit.

A lower electrode and/or an upper electrode of the secondary battery is connected to power supply layer wiring inside the circuit via a wiring layer of the circuit and a via hole. Further, the secondary battery can also be connected to a pad that is arranged to supply power to another electric component at packaging.

The circuit is provided with a circuit that controls the secondary battery, and electrodes of the secondary battery are connected thereto via wiring and a via hole.

The secondary battery may be a plurality of divided secondary batteries, or a plurality of secondary batteries may be stacked.

The secondary battery is directly fabricated on a circuit surface which has been subjected to passivation (surface protection). Further, at least a part or whole of an uppermost wiring layer of multilayer wiring of the circuit can be a negative electrode or a positive electrode with a surface structure and can be used in common with a negative electrode or a positive electrode of the secondary battery.

A lower electrode and an upper electrode of the secondary battery may be connected to power supply wiring or a secondary battery control circuit in the circuit chip via an outside of the circuit chip, or a lower electrode and an upper electrode of the secondary battery may be connected to power supply wiring or a secondary battery control circuit in the circuit via a via hole penetrating a substrate of the circuit chip.

By mounting a quantum battery as the secondary battery, the secondary battery can be fabricated at a temperature of 400° C. or lower. This is excellent in the point of capable of avoiding break of the existing circuit chip due to the secondary battery mounting process. Here, the quantum battery refers to the secondary battery disclosed in WO 2013/065093A1 filed by the applicant of this application.

A manufacturing method of a secondary battery-mounted circuit chip is a manufacturing method of a secondary battery-mounted circuit chip having a secondary battery mounted on a circuit, the method including: a lower electrode layer forming step of forming, on an upper surface which has been subjected to passivation for a plurality of circuits formed on a wafer, a lower electrode layer divided for each circuit chip and patterned in a region except a region where the circuit chip is electrically connected, and a region including a connection portion with wiring of a passivation lower layer; a charge layer forming step of forming a charge layer that stores electricity, by application and burning of a charge layer material on a lower electrode of the wafer; and an upper electrode layer forming step of forming a patterned upper electrode layer at least on the charge layer and in a region connected to lower layer wiring of a passivation layer.

Another manufacturing method of a secondary battery-mounted circuit chip is a manufacturing method of a secondary battery-mounted circuit chip having a secondary battery mounted on a circuit, the method including: a charge layer forming step of forming, on a circuit chip in which a lower electrode pattern of the secondary battery exposed after passivation at uppermost layer wiring of the circuit chip, a charge layer that stores electricity, by application and burning of a charge layer material; and an upper electrode layer forming step of forming a patterned upper electrode layer at least on the charge layer and in a region connected to a passivation lower layer.

A still another manufacturing method of a secondary battery-mounted circuit chip is a manufacturing method of a secondary battery-mounted circuit chip having a secondary battery mounted on a circuit, the method including: a step of forming an insulating layer on a rear surface of a substrate of a plurality of circuits formed on a wafer; a lower electrode layer forming step of forming a lower electrode layer divided for each circuit chip; a charge layer forming step of forming a charge layer that stores electricity, by application and burning of a charge layer material on a rear surface of the wafer on which the lower electrode layer has been formed and at least on the lower electrode; a charge layer photoresist pattern forming step of forming a photoresist pattern for charge layer corresponding to each circuit, on the charge layer; a charge layer removing step of removing a charge layer region where the photoresist pattern for charge layer does not exist; a charge layer photoresist pattern removing step of removing the photoresist pattern for charge layer; and an upper electrode layer forming step of forming a patterned upper electrode layer in a region of the lower electrode, except a region of the lower electrode connected the outside, and the charge layer.

In the forming steps of the upper electrode and the lower electrode, a photoresist patterns is formed and an electrode film is formed, and then a resist is removed and lifted off to form a pattern.

In the forming steps of the upper electrode and the lower electrode, an electrode film is formed, then the electrode film is etched using a photoresist pattern as a mask, and a resist is removed to form a pattern.

In the lower electrode layer forming step, the charge layer forming step, and the upper electrode layer forming step, patterning can be performed to form a plurality of secondary batteries.

Note that the lower electrode layer forming step, the charge layer forming step and the upper electrode layer forming step can be performed by not only using photoresist pattern but also using a printing technique.

The charge layer forming step includes: a charge layer forming step of forming a charge layer that stores electricity, by application and burning of a charge layer material at least in a region including the whole lower electrode layer on a front surface or a rear surface of the wafer on which the lower electrode layer has been formed; a charge layer photoresist pattern forming step of forming a photoresist pattern for charge layer corresponding to the lower electrode charge layer; a charge layer removing step of removing a charge layer region where the photoresist pattern for charge layer does not exist; and a charge layer photoresist pattern removing step of removing the photoresist pattern for charge layer.

Generally, the secondary battery-mounted circuit chip manufactured by the manufacturing methods of the secondary battery-mounted circuit chip is used after a step of testing the battery and a conditioning step of performing conditioning by applying voltage to the secondary battery.

Effects of the Invention

The present invention is a secondary battery-mounted circuit chip in which a secondary battery is formed on a surface opposing a circuit region fabricated on a wafer. The secondary battery-mounted circuit chip in which the secondary battery and the circuit are formed into the integrated structure by forming the secondary battery on the uppermost part of the circuit having multilayer wiring and forming the secondary battery on the upper part of the circuit surface subjected to passivation, forming the secondary battery directly stacked by making the wiring layer in the uppermost part of the multilayer wiring part of the circuit in a surface structure to be used in common, or forming the secondary battery on the rear surface of the substrate having the circuit formed thereon. This makes it possible to form the secondary battery on the entire surface of a circuit fabrication region, so that the charge capacity is large as compared with the case of forming the secondary battery in a partial region of the circuit. Mounting the secondary battery on every circuit chip to be packaged on an electric device makes it possible to significantly save the space for the secondary battery and is thus effective for downsizing the device.

Further, the manufacturing method of the secondary battery-mounted circuit chip simultaneously forms a plurality of secondary battery-mounted circuits on a wafer, and a thick charge layer can be formed, by applying and burning a charge layer material on the entire wafer surface, more easily than by the sputtering method and the vapor evaporation method.

The power to be supplied from the stacked secondary battery-mounted circuit chips can also be utilized for power supply to other electric components at the packaging of the devices on the substrate through the leads of the packages. This is because the power is used not only for the backup power supply for the logic circuit and memory inside the circuit but also for the power supply of the whole device when the chip is mounted on the device, thereby enabling significant reduction of space. The lower electrode and/or the upper electrode for the positive electrode or the negative electrode is connected to the power supply layer wiring inside the circuit via a via hole and is utilized as the power supply of the circuit.

BEST MODE FOR CARRYING OUT THE INVENTION

Figure 1:
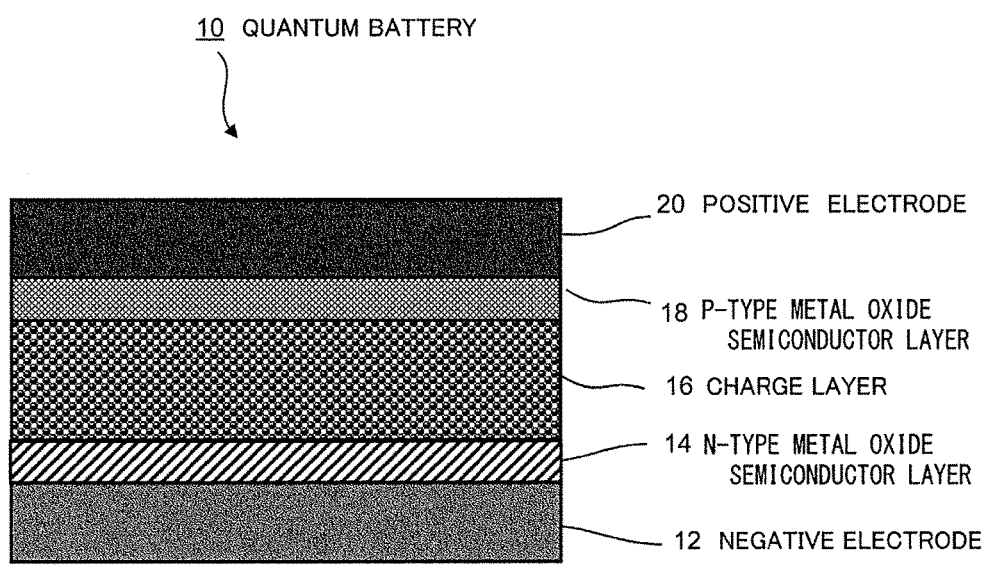
FIG. 1 is a view for explaining a quantum battery to be mounted on a wafer in the present invention.

The all-solid secondary battery is safe and high in energy density, can be fabricated by a thin film and greatly save the mounting space, and is therefore suitable for downsizing of a device. The present invention is a secondary battery-mounted circuit chip in which a secondary battery is formed on a surface facing a circuit region and packaged as an integrated structure to thereby achieve further space-saving. The structure of the secondary battery is not limited. Namely, the secondary battery is the one which does not need any additional substrate and can be manufactured by a process not exerting thermal, mechanical, electrical influence on the circuit.

Here, an example of a secondary battery structure to be mounted on a circuit formed on a silicon substrate will be described first, but the present invention is not limited to the secondary battery structure. The circuit has at least a component composed of a logic circuit, a sensor or MEMS (Micro electro Mechanical Systems), is formed with a functional element such as a memory element or a CPU (Central Processing Unit) each of which is a logic circuit composed of an electronic circuit, or MEMS made by adding any of a mechanical component, a sensor, and an actuator to the electronic circuit, and is described below as an integrated circuit taking a circuit mainly composed of electronic circuits as an example. Further, the secondary battery-mounted circuit chip is also referred to as a secondary battery-mounted integrated circuit chip in the sense that the secondary battery is mounted on the integrated circuit. Further, the lower electrode and the upper electrode indicate electrodes in a positional relation between the relatively lower part and upper part in the drawings and mean a negative electrode and a positive electrode in an electrical sense, and are thus described below properly using those names.

FIG. 1 is a secondary battery utilizing titanium oxide for a charge layer. The secondary battery is disclosed, for example, in WO 2013/065093A1 filed by the applicant of this application and described as a quantum battery, and is thus described as a quantum battery below herein.

In FIG. 1, a quantum battery 10 is configured such that an n-type metal oxide semiconductor layer 14, a charge layer 16 that charges energy therein, a p-type metal oxide semiconductor layer 18, and a positive electrode 20 are stacked on a conductive negative electrode 12.

The negative electrode 12 and the positive electrode 20 are conductive films, which are aluminum or the like used, for example, in a semiconductor manufacturing process. The forming method thereof is generally the sputtering on the substrate. Note that other metals and forming methods may be used as long as the forming temperature does not influence an article to be mounted (semiconductor integrated circuit in this case).

As the material of the n-type metal oxide semiconductor layer 14, titanium oxide, tin oxide, zinc oxide or the like can be used.

In the charge layer 16, an n-type metal oxide semiconductor in the form of fine particles covered with insulating coating is filled. The n-type metal oxide semiconductor is covered with silicon insulating coating. Examples of the n-type metal oxide semiconductor usable in the charge layer 16 include titanium oxide, tin oxide, zinc oxide and the like, among which titanium oxide is preferable.

As the material of the p-type metal oxide semiconductor layer 18, nickel oxide, copper/aluminum oxide or the like can be used.

The secondary battery of the secondary battery-mounted circuit chip of the present invention is a secondary battery with a parasitic structure having no substrate of the secondary battery itself, which structure makes it possible to greatly reduce the space. As described above, the secondary battery is directly fabricated on the circuit and thereby mounted in the present invention, and the secondary battery is not only used as a power supply of the circuit on which it is mounted but can also supply energy to other elements.

Next, a manufacturing method of directly fabricating the secondary battery after finish of a pre-process where passivation is performed will be described. Note that this technique is not limited to the silicon substrate, but is applicable also to a SiC substrate, a glass substrate, a flexible substrate on which functional elements are formed.

Figure 2:
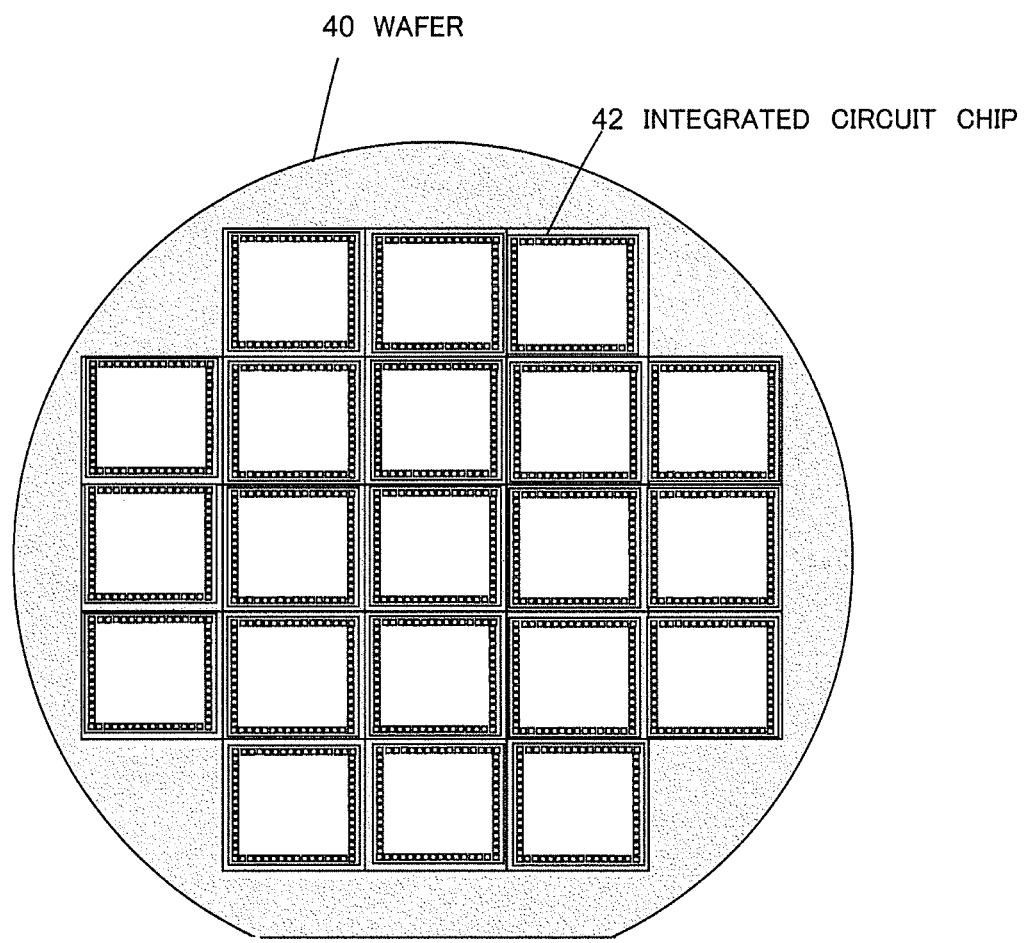
FIG. 2 illustrates a wafer on which a plurality of integrated circuit chips are fabricated.
Figure 3:
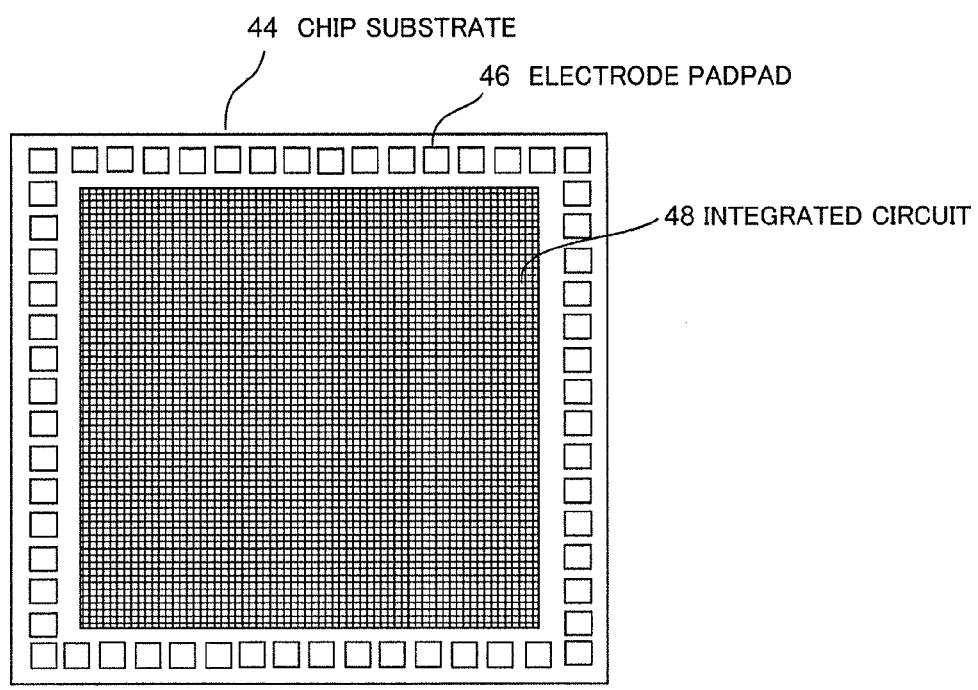
FIG. 3 is a view for explaining the configuration of an integrated circuit chip.

FIG. 2 is a plan view of a wafer where integrated circuits have been manufactured in a batch. Many integrated circuit chips 42 are formed on the wafer by the semiconductor manufacturing process. In each of the integrated circuit chips 42, for example, electrode pads 46 are arranged at the end portion of a chip substrate 44, and an integrated circuit 48 is formed inside thereof as illustrated in FIG. 3. The integrated circuit is, for example, a logic circuit such as a memory, a CPU or the like, in which many MOS transistors are arranged. On the integrated circuit chip, MEMS such as a mechanical component, a sensor, or an actuator may be mounted in addition to a logic circuit such as a memory, a CPU or the like being an electronic circuit. The region of the secondary battery is limited depending on the functional element to be mounted in some cases, which case can be handled by the patterning in the forming process of each layer.

Figure 4:
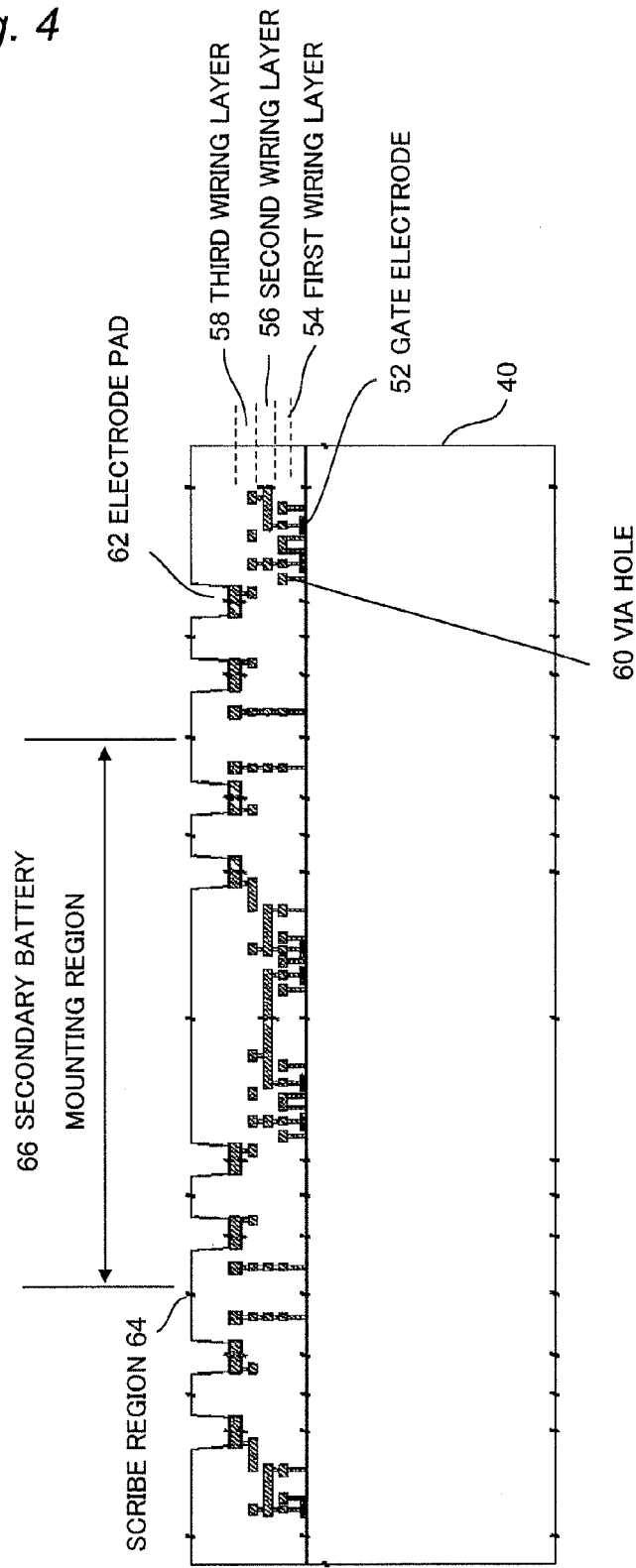
FIG. 4 is a view for explaining the cross section of the integrated circuit chip.

FIG. 4 is an example illustrating a cross-sectional view of an integrated circuit chip part which has been subjected to passivation on the wafer. In the integrated circuit chip formed on a wafer 40, a secondary battery is formed in a secondary battery mounting region 66 on each integrated circuit unit, and cut at a scribe region 64 to be separated as an integrated circuit chip.

The cross-sectional view illustrates a multilayer wiring structure in which a gate electrode 52, a first wiring layer 54, a second wiring layer 56, and a third wiring layer 58 are provided. The wiring layers are connected to one another by a via hole 60. For electric connection with the external part, an electrode pad 62 is provided.

Here, the illustration is presented with the well diffusion layer structure used in a CMOS, the element isolation structure, the source/drain diffusion layer omitted therefrom. Further, the dimension is indicated by an aspect ratio different from the actual dimension. For example, a pad region is several tens of microns in the lateral direction, whereas is about one micron in the longitudinal direction.

On the uppermost wiring (here, the third wiring layer 58), a passivation film is formed as a surface protective film and opens above the pad for wire bonding. In the semiconductor process, back grinding and test processes are subsequently performed. In the state that the pad opening is finished, the secondary battery is stacked on an integrated circuit surface to manufacture the secondary battery-mounted integrated circuit chip. Note that in the case of forming a secondary battery on a rear surface, the secondary battery is formed at the time when the back grinding is finished, to manufacture the secondary battery-mounted integrated circuit chip.

Figure 5:
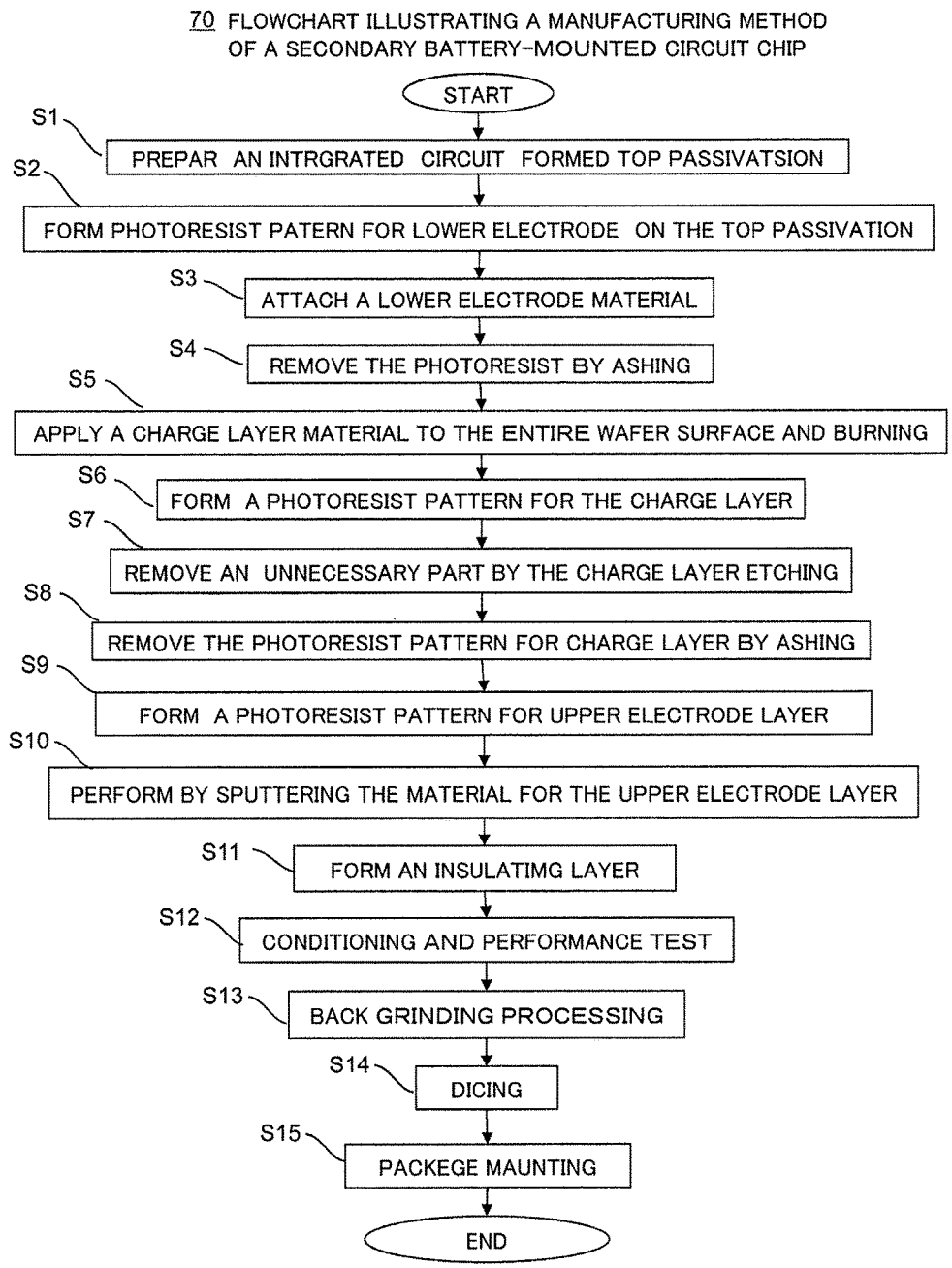
FIG. 5 is a flowchart illustrating a manufacturing method of a secondary battery-mounted circuit chip.
Figure 6:
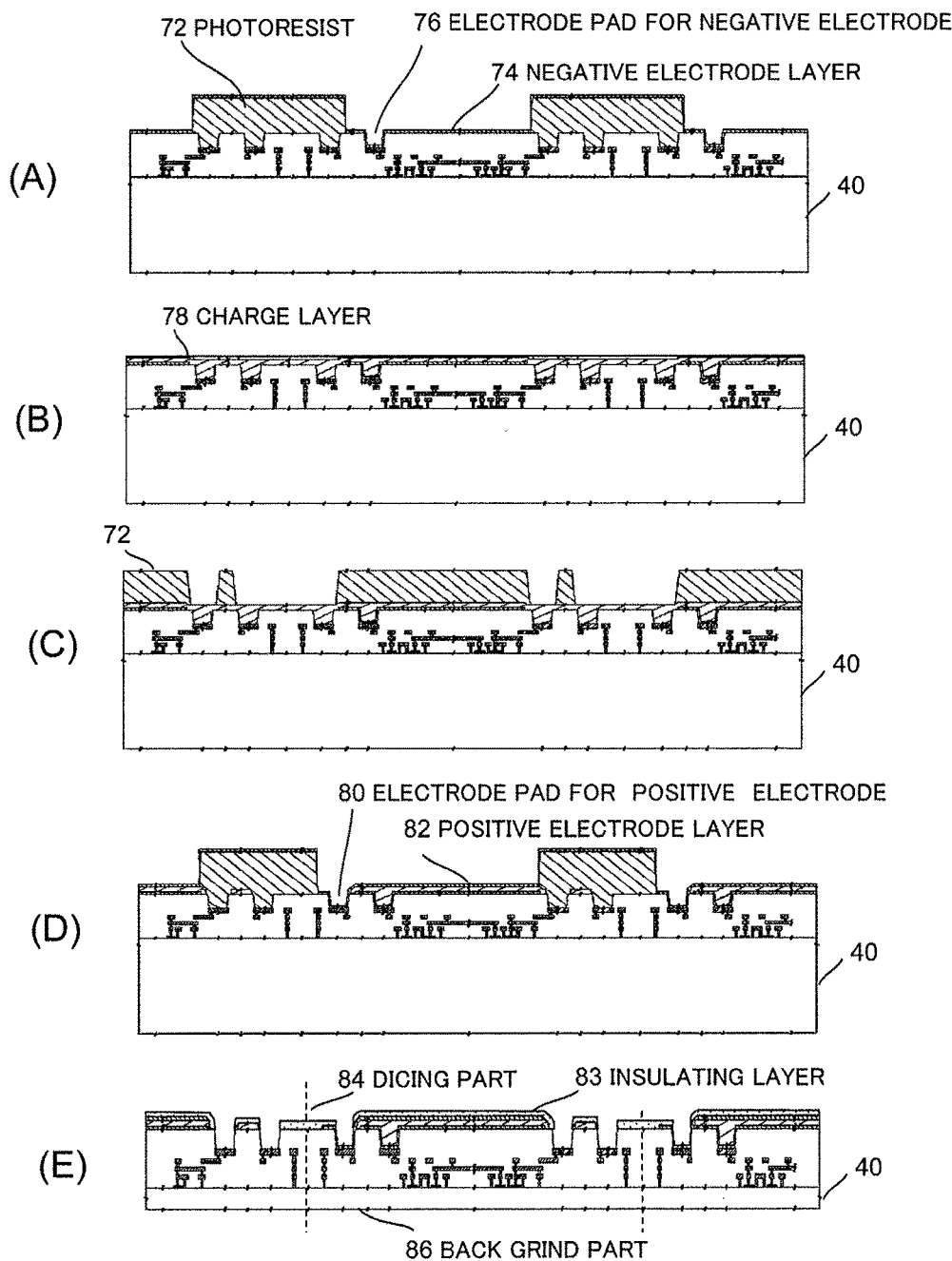
FIG. 6 is a cross-sectional view of a secondary battery-mounted integrated circuit chip in the manufacturing process for explaining the manufacturing method.

FIG. 5 is a flowchart 70 of a manufacturing method of the secondary battery-mounted circuit chip. FIG. 6 illustrates the cross section of the secondary battery-mounted integrated circuit chip in the manufacturing process illustrated in FIG. 5. Hereinafter, description is made referring to FIG. 6 and following the flowchart 70 of the manufacturing method of the secondary battery-mounted circuit chip illustrated in FIG. 5. Note that terms of a lower electrode layer and an upper electrode layer are used in the description and mean a layer on the negative electrode side and a layer on the positive electrode side as viewed from the charge layer 16 of the secondary battery illustrated in FIG. 1.

For example, the lower electrode layer in the state illustrated in FIG. 1 is composed of the negative electrode 12 and the n-type metal oxide semiconductor layer 14, and the upper electrode layer is composed of the positive electrode 20 and the p-type metal oxide semiconductor layer 18. In a drawing made by turning the battery upside down to locate the positive electrode on the lower side, the lower electrode layer is composed of the positive electrode 20 and the p-type metal oxide semiconductor layer 18, and the upper electrode layer is composed of the negative electrode 12 and the n-type metal oxide semiconductor layer 14. In the secondary battery in either structure, the cathode and the anode are changed any of which may be the lower electrode.

At the first Step S1, an integrated circuit wafer is prepared which has been subjected to the pre-process and has a passivation layer formed thereon. At Step S2, a photoresist pattern for lower electrode layer is formed on the passivation layer. The formation of the photoresist pattern is performed by photolithography in which a photoresist (photosensitive rein) is applied to the wafer, light is applied to a region other than a lower electrode layer formation region to alter the resin, and a portion which has not been altered is dissolved with a developing solution. The application of the photoresist is performed by spin-coating of dripping a liquid photoresist onto the wafer rotated at a high speed. Thereafter, the solvent therein is evaporated at a temperature of about 100° C. Then, the photoresist is irradiated with light (ultraviolet ray) by a stepper in an exposure apparatus, and development is performed to remove a portion thereof other than an irradiated portion. Since the lift-off process is employed here, a negative resist is used which enables an inversely tapered shape to be easily obtained.

Next, a lower electrode material for forming the lower electrode layer is attached at Step S3. The lower electrode layer is made by two steps of forming the negative electrode and the n-type metal oxide semiconductor layer, for example, in the case of mounting the quantum battery illustrated in FIG. 1. The film formation of the lower electrode layer is performed by sputtering or vacuum depositing the material for the lower electrode layer. Then, the photoresist is removed by ashing with oxygen plasma at Step S4, whereby the lower electrode layer is formed. Here, for the negative electrode, a pattern is formed by the lift-off method using a conductive metal material.

FIG. 6(A) illustrates the state that a negative electrode 74 as the lower electrode and an electrode pad 76 for negative electrode are film-formed, in which a negative electrode material is film-formed at a portion which is not covered with the photoresist 72. A region which is covered with the photoresist 72 where the lower electrode is not formed is a pad region where the uppermost wiring layer is exposed and a scribe region. However, the lower electrode is formed in the pad region which is used for connecting the electrodes of the quantum battery with the integrated circuit or the element at the lower layer such as a power supply wiring. The connection with the integrated circuit may be realized by providing a region where the wiring in the uppermost layer is exposed other than the pad and connecting the lower electrode layer to the region.

After the lower electrode layer is film-formed, a charge layer is formed. At Step S5 in FIG. 5, a material for the charge layer is applied to the entire wafer surface and burning the material by heating. The material for the charge layer is necessarily liquid, so that the charge layer can be manufactured in a short time by application of the material. The application is performed by the spin-coating method of dripping the liquid charge layer material while rotating the wafer at a high speed to form the charge layer on the entire wafer surface.

By this method, a uniform charge layer is formed on the entire wafer surface. Since the charge layer material is liquid, the reflow phenomenon can be utilized to make the surface into a substantially flat surface even when the surface has asperities. FIG. 6(B) illustrates the state that a charge layer 78 is formed on the entire wafer surface. The charge layer 78, in the case of the quantum battery, is made by applying the charge layer material, then burning it by heating, and activating the titanium oxide by application of the ultraviolet ray so as to fulfill the charging function.

Further, the p-type metal oxide semiconductor layer of the upper electrode layer is formed on the entire wafer surface by the sputtering method or the like. Unnecessary portions of the charge layer 78 and the p-type metal oxide semiconductor layer formed on the entire wafer surface are removed by etching. To this end, at Step S6, a photoresist pattern is formed on the p-type metal oxide semiconductor layer to perform masking on a portion which is to be remained as the charge layer. For the formation of the photoresist pattern, the lithography method is used which is the same technique as that of the formation of the photoresist pattern for negative electrode layer. FIG. 6(C) illustrates the state that the photoresist 72 for the charge layer is formed.

The etching at Step S7 is performed by applying high-frequency energy to gas molecules which can remove the charge layer material, for example, carbon tetrafluoride gas (CF4) to make the gas into plasma and thereby make the molecules radical state. This removes the charge layer at a portion having no photoresist. The photoresist for charge layer is removed by ashing with oxygen plasma at Step S8. As necessary, wet cleaning is performed.

Next, at Step S9, a photoresist pattern for upper electrode is formed. The formation of the photoresist pattern is performed by lithography and is the same as the Step S3 which has been explained for film formation for the lower electrode layer. At Step S10, an upper electrode material for forming the upper electrode is attached. The film formation of the upper electrode is the same as the film formation of the lower electrode, and performed by sputtering or vacuum depositing the material for the upper electrode layer, removing the photoresist for positive electrode by ashing.

FIG. 6(D) illustrates the state that a photoresist 72 for the upper electrode is formed. A positive electrode 82 is wired also at an electrode pad 80 for positive electrode.

Note that at Step S2, Step S6, Step S9, the formation is performed using the lithography method with the photolithography pattern, and the same effect can be obtained also by a printing technology. Examples of the printing technology include, for example, screen, gravure and inkjet printing.

The secondary battery is completed by the steps so far, and the surface of the secondary battery formed at Step S11 is covered with an insulating layer for protection as necessary. To exert the function of the secondary battery, conditioning and performance test are performed at Step S12. The conditioning is electric stabilization processing in an initial manufacturing state.

After bringing the secondary battery into an electric stabilized state by the conditioning, the performance test as the secondary battery is performed.

At the pre-process of forming the integrated circuits on the wafer, a thick wafer is used to prevent the wafer from being broken in the manufacturing process. For example, a wafer with a diameter of 300 mm, its thickness is 775±25 m, and this thickness is too large as the integrated circuit chips. Therefore, the wafer is ground to be thinned by the back grinding processing at Step S13. In the back grinding processing, the wafer is ground by a die having a diamond attached to the edge of its blade and thereby finished to have generally a thickness of about 300 μm.

The wafer which has been subjected to the back grinding processing is diced and separated as integrated circuit chips at Step S14. FIG. 6(E) illustrates the state of the wafer which has been subjected to the back grinding processing, in which the rear surface of the wafer is a back grind part 86 and a dicing part 84 exists in the scribe region.

Note that many examples in which the integrated circuits are formed on the wafer are illustrated in the above, because semiconductor integrates circuits are generally fabricated on a wafer, and there is no necessity to form the circuits of the present invention on a wafer.

Figure 7:
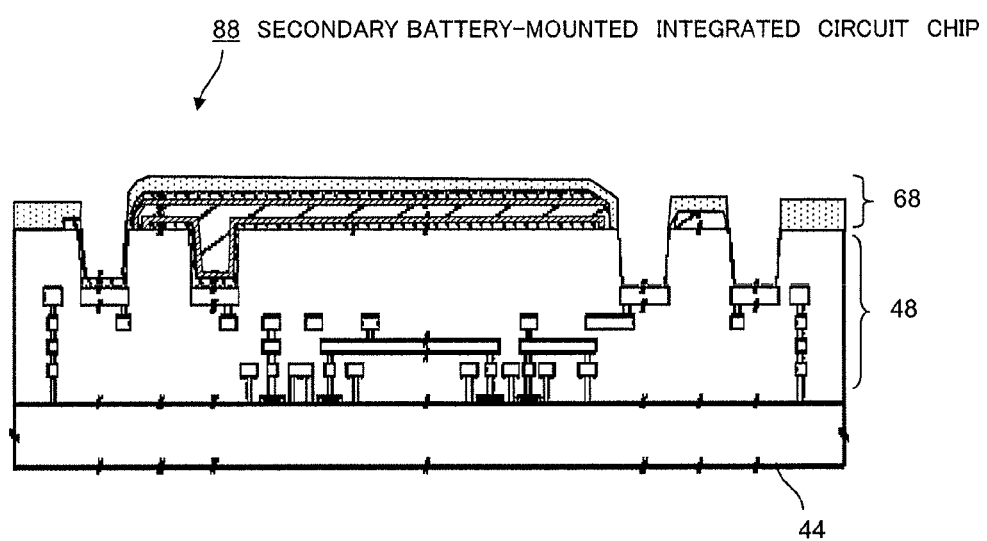
FIG. 7 is a cross-sectional view of a completed secondary battery-mounted integrated circuit chip.

FIG. 7 illustrates the cross section of a secondary battery-mounted integrated circuit chip 88 which has been subjected to the back grinding processing and dicing. The integrated circuit 48 and a mounted secondary battery 68 thereon are integrally formed on the chip substrate 44 such as silicon. The secondary battery-mounted integrated circuit chip separated by the integrated circuit chip dicing is packaged, for example, on a package at Step S15.

Whether the quality of electric characteristics of the secondary battery-mounted integrated circuit chip has been determined by the test, and only chips with good quality are vacuum-sucked and taken out by a collet. An Ag paste has been applied on a lead frame on which the chip is to be packaged, the chip is scrubbed and bonded thereto, and then the Ag paste is cured to fix the chip. The electrode pad of the chip and the outer electrode of the lead frame are connected by wire bonding. Then, the resultant is sealed with a mold, resulting in a completed secondary battery-mounted integrated circuit chip.

Next, the secondary battery-mounted integrated circuit chip in the case where the uppermost wiring layer of a multilayer wiring part of the integrated circuit is the negative electrode surface or the positive electrode surface with a surface structure, and the negative electrode surface or the positive electrode surface is used in common as the negative electrode or the positive electrode of the secondary battery to be stacked thereon will be described.

Figure 8:
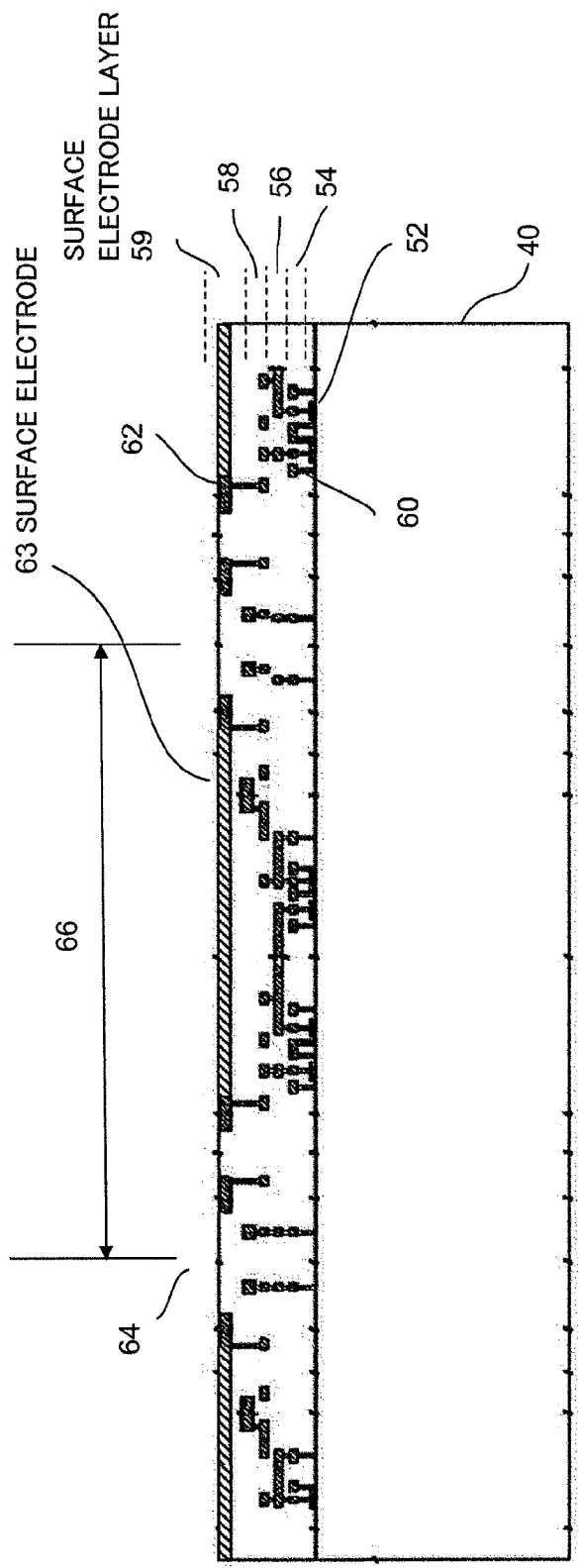
FIG. 8 illustrates an integrated circuit chip in which the uppermost layer of the integrated circuit according to the present invention is a surface electrode.

FIG. 8 is an example illustrating the cross-sectional view of the integrated circuit chip part in which the uppermost wiring layer of the multilayer wiring part of the integrated circuit is configured such that the electrode with a surface structure is formed on a wafer. The integrated circuit chips formed on the wafer 40, in which the secondary battery is formed in the secondary battery mounting region 66 on each integrated circuit unit, are cut at the scribe region 64 and separated as integrated circuit chips.

The multilayer wiring part of the integrated circuit is configured as the multilayer wiring structure in which the first wiring layer 54, the second wiring layer 56, and the third wiring layer 58 are provided, a surface electrode layer 59 is provided on the third wiring layer 58, and the wiring layers are connected with one another via the via hole 60 as illustrated, for example, in FIG. 8. A surface electrode layer 59 provided with a surface electrode 63 may be newly provided but, in the case of a copper wiring process, the aluminum wiring in the uppermost layer is configured to be used only as the electrode pad in some cases. In such a multilayer wiring structure, there is no need to newly provide the surface electrode layer 59 and the same layer as the electrode pad can be utilized as the surface electrode layer 59.

The surface electrode 63 may be the positive electrode or the negative electrode. Here, the surface electrode 63 is described as the negative electrode below.

The surface electrode 63 is provided in common with the negative electrode of the secondary battery to be mounted, thus making it possible to omit the manufacturing process of the negative electrode in manufacturing the secondary battery so as to achieve cost reduction and further size reduction.

Figure 9:
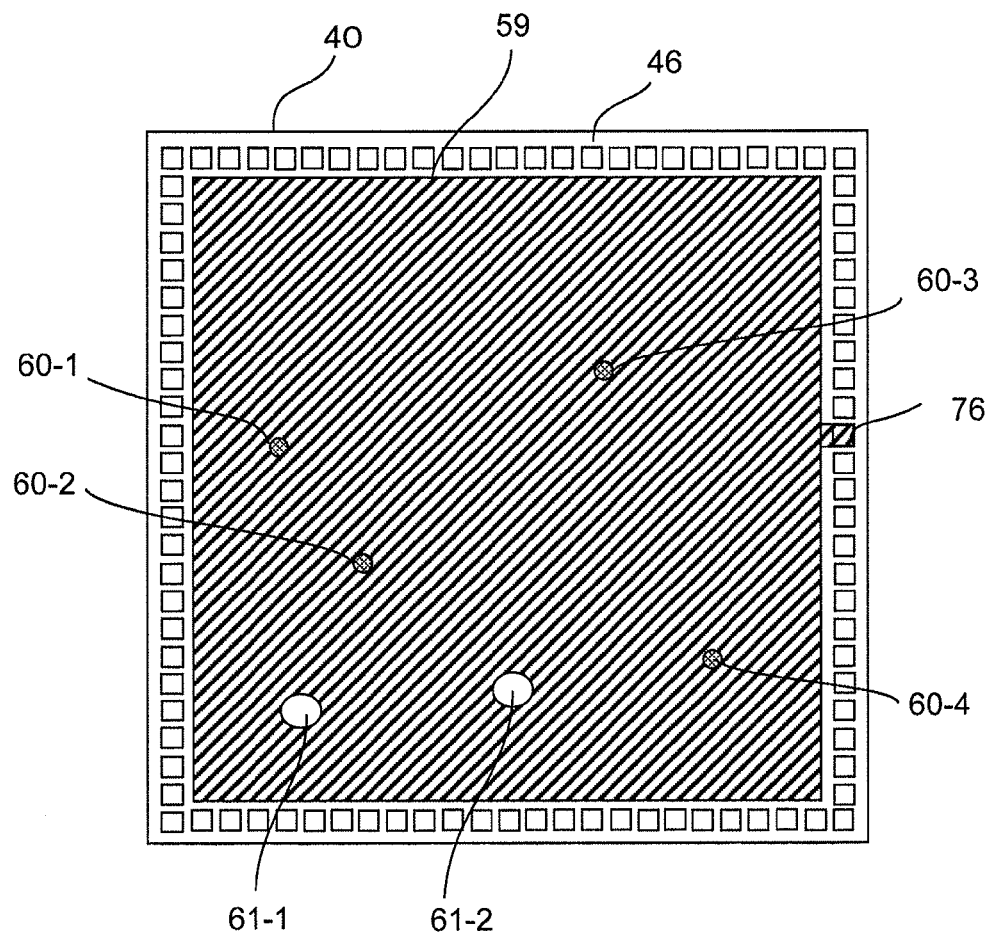
FIG. 9 is a plan view of the integrated circuit chip in which the uppermost layer is a surface electrode.

FIG. 9 illustrates a plan view of the secondary battery mounting region 66 of the integrated circuit chip part in FIG. 8. In the uppermost layer of the integrated circuit wiring part of the wafer 40, the electrode pads 46 are also formed, and the surface electrode is connected to the electrode pad 76 for negative electrode. In a region surrounded by the plurality of electrode pads 46, the integrated circuit is formed, and its uppermost layer is the surface electrode 63. In the surface electrode 63, there are via holes 60-1, 60-2, 60-3, 60-4 directly connected to earth electrodes in the wiring layers of the integrated circuit. The via hole directly connected to the earth electrode depends on the design of the wiring layer of the integrated circuit, and any number of via holes can be provided at any places. Further, it is also possible to provide via holes 61-1, 61-2 for positive electrode for directly connecting the positive electrode in the uppermost layer part of the secondary battery to be mounted to the power supply voltage of the integrated circuit wiring part. The positive electrode of the secondary battery is insulated by an insulating layer and directly connected to the power supply voltage of the integrated circuit wiring part via the via holes 61-1, 61-2 for positive electrode.

Figure 10:
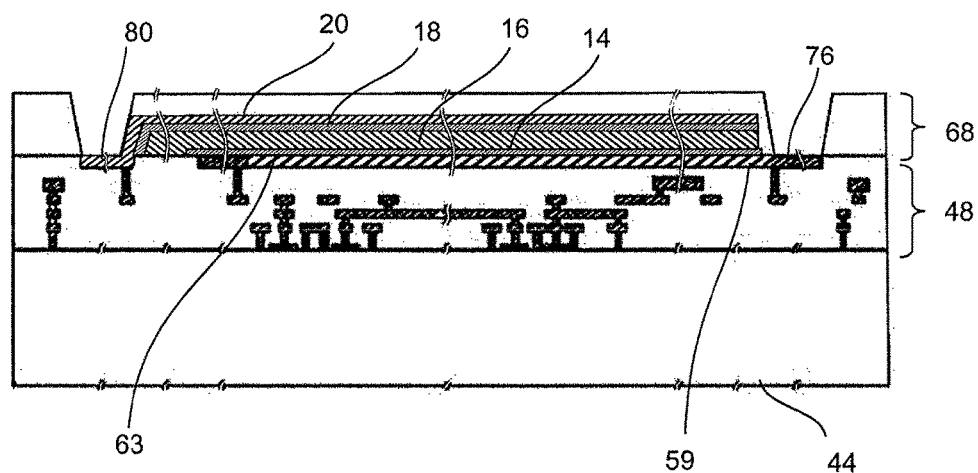
FIG. 10 is a cross-sectional view of the secondary battery-mounted integrated circuit chip in which electrodes of the integrated circuit and the secondary battery are provided in common.

FIG. 10 is a cross-sectional view of the secondary battery-mounted integrated circuit chip in which the surface electrode 63 being the uppermost wiring layer of the multilayer wiring part of the integrated circuit is the negative electrode surface and the negative electrode surface is provided in common with the negative electrode of the secondary battery to be stacked, and the quantum battery illustrated in FIG. 1 is mounted as an example. On the chip substrate 44, the integrated circuit 48 is formed, and the uppermost layer of the multilayer wiring part of the integrated circuit 48 is provided with the surface electrode 63. The surface electrode 63 is used in common with the negative electrode 12 of the mounted secondary battery 68 thereon. Therefore, the quantum battery has a structure in which the n-type metal oxide semiconductor layer 14, the charge layer 16, the p-type metal oxide semiconductor layer 18, and the positive electrode 20 are sequentially stacked on the surface electrode. The n-type metal oxide semiconductor layer 14, the charge layer 16, the p-type metal oxide semiconductor layer 18, and the positive electrode 20 are configured to cover their respective lower layers, and the positive electrode 20 is connected with the electrode pad 80 for positive electrode.

As the manufacturing method, the manufacturing method of the secondary battery-mounted circuit chip illustrated in FIG. 5 can be used. The different points are that an integrated circuit wafer having the surface electrode layer 59 completed thereon is prepared as the integrated circuit wafer on which the passivation layer at Step S1 has been formed, and that the step of forming the lower electrode layer at Step S2 needs to be performed only once of stacking the n-type metal oxide semiconductor layer 14. Further, the insulation layer formation at Step S11 may be passivation layer formation.

Figure 11:
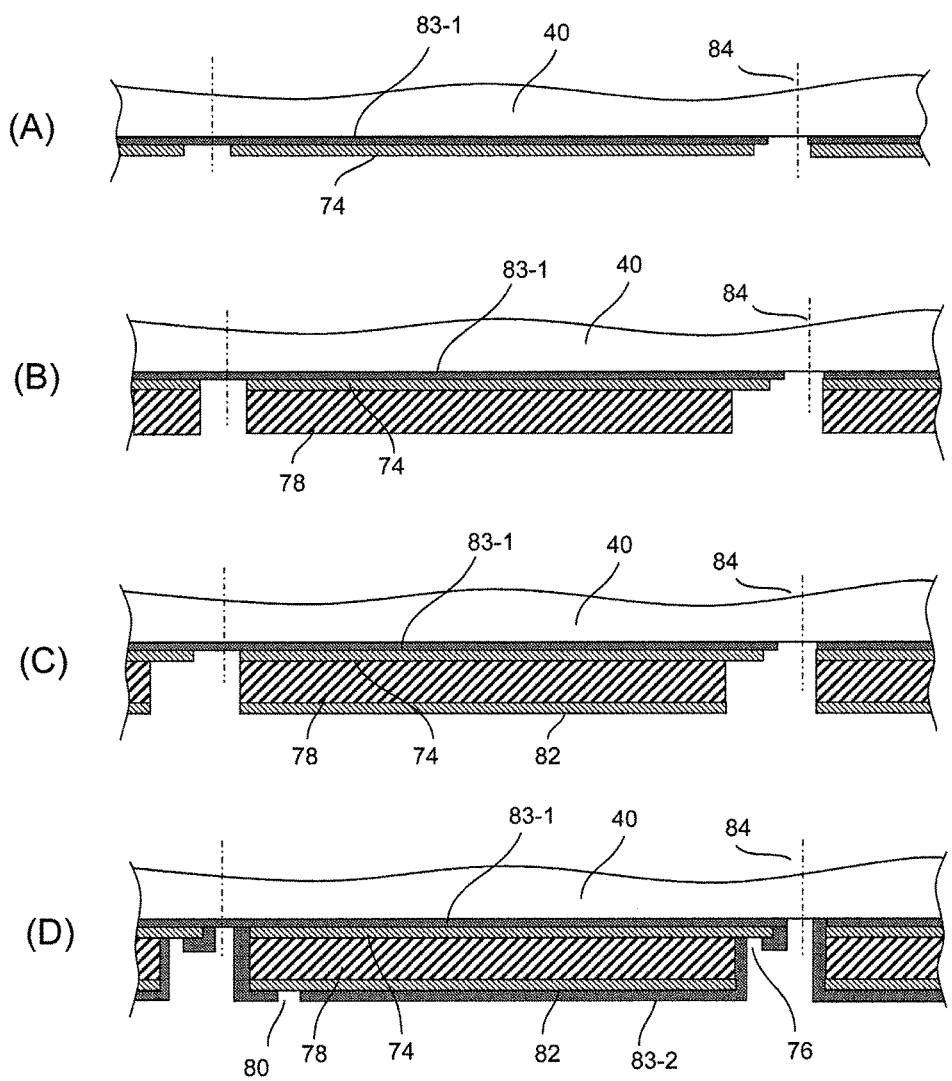
FIG. 11 is a cross-sectional view of the secondary battery-mounted integrated circuit chip in the manufacturing process in the case of mounting the secondary battery on the rear surface of the wafer.

FIG. 11 is a view illustrating the manufacturing process of the secondary battery-mounted integrated circuit chip on the rear surface of the wafer on which the integrated circuit is formed, in which the integrated circuit part on the upper surface of the wafer is omitted. As the manufacturing method of the secondary battery on the rear surface of the wafer, the manufacturing method of the secondary battery-mounted integrated circuit chip illustrated in FIG. 5 can also be used. In the formation of the secondary battery on the rear surface of the wafer, a wafer on which the passivation layer has been formed at Step S1 and subjected to the back ground processing performed at Step S13 is prepared, and an insulating layer for prevention of leakage is provided on the rear surface of the wafer, and then the secondary battery is fabricated. Note that the back grinding step needs to be performed before formation of the quantum battery.

FIG. 11(A) illustrates the state that an insulating layer 83-1 and a negative electrode 74 are stacked on the rear surface of the wafer, and corresponds to the state that Step S4 in the flowchart 70 of the manufacturing method of the secondary battery-mounted circuit chip in FIG. 5 has been finished. The insulating layer 83-1 is formed by sputtering, for example, $SiO_2$. On the rear surface of the wafer, the secondary battery sufficiently utilizing the chip surface can be formed because there is no electrode pad for signal, and the negative electrode 74 is formed as large as possible except the scribe region to thereby increase the capacity as the secondary battery. The scribe region is cut at the dicing part 84 to form an individual integrated circuit chip.

FIG. 11(B) illustrates the state that the charge layer 78 has been formed, and corresponds to the state that Step S8 in the flowchart 70 of the manufacturing method of the secondary battery-mounted circuit chip in FIG. 5 has been finished. The charge layer 78 is formed except a portion through which the negative electrode is taken out at packaging.

FIG. 11(C) illustrates the state that the positive electrode 82 has been formed, and corresponds to the state that Step S10 in the flowchart 70 of the manufacturing method of the secondary battery-mounted circuit chip in FIG. 5 has been finished.

FIG. 11(D) illustrates the state that the surface protection and the insulating layer 83 for securing insulation property at packaging have been formed, and corresponds to the state that Step S11 in the flowchart 70 of the manufacturing method of the secondary battery-mounted circuit chip in FIG. 5 has been finished. The secondary battery-mounted integrated circuit chip after fabricated is packaged on a substrate, but because there is a need to take out the negative electrode and the positive electrode to the outside at packaging, the insulating layer 83-2 is not provided at those portions which are used as the electrode pad 76 for negative electrode and the electrode pad 80 for positive electrode.

Figure 12:
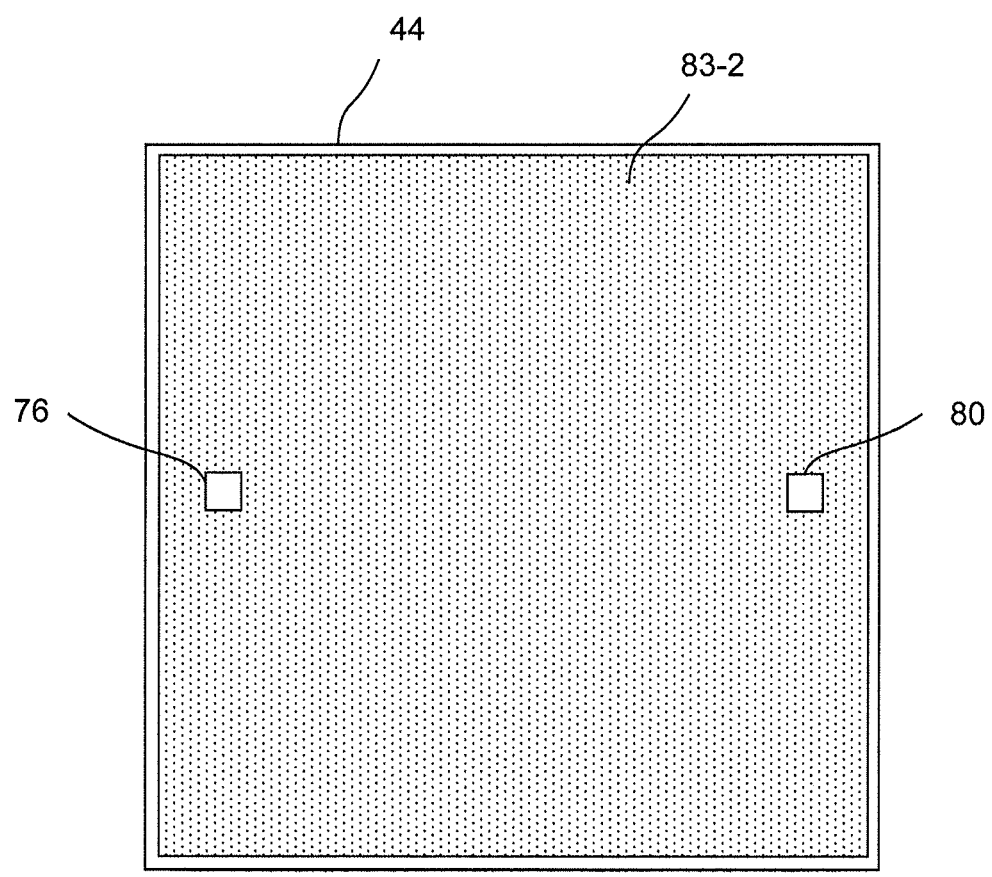
FIG. 12 is a view illustrating a rear flat surface in the case where the secondary battery is mounted on the rear surface of the wafer.

FIG. 12 is a plan view of the rear surface of the secondary battery-mounted integrated circuit chip cut at the dicing part. In the insulating layer 83-2 of the secondary battery formed on the rear surface of the chip substrate 44, the electrode pad 76 for negative electrode and the electrode pad 80 for positive electrode are provided. The electrode pad 76 for negative electrode and the electrode pad 80 for positive electrode are bonded to the package substrate with a conductive paste and thereby be packaged thereon.

Figure 13:
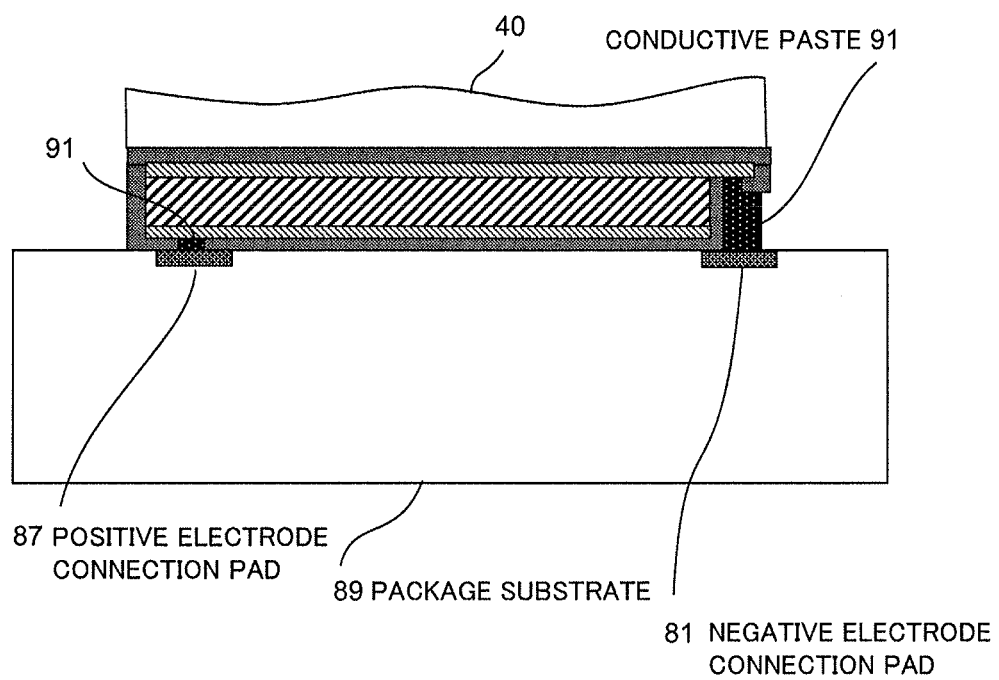
FIG. 13 is a view of mounting on a package substrate in the case where the secondary battery is mounted on the rear surface of the wafer.

FIG. 13 illustrates the state that the secondary battery-mounted integrated circuit chip having the secondary battery formed on the rear surface of the wafer with the integrated circuit formed thereon is mounted on a package substrate 89, in which the wafer upper part including the integrated circuit part is omitted. The package substrate 89 is provided with a negative electrode connection pad 81 and a positive electrode connection pad 87, and the secondary battery-mounted integrated circuit chip is fixed to the negative electrode connection pad 81 and the positive electrode connection pad 87 using a conductive paste 91 and electrically connected thereto. In the package substrate 89, not-illustrated internal wiring patterns is formed to which the negative electrode connection pad 81 and the positive electrode connection pad 87 are connected respectively.

Figure 14:
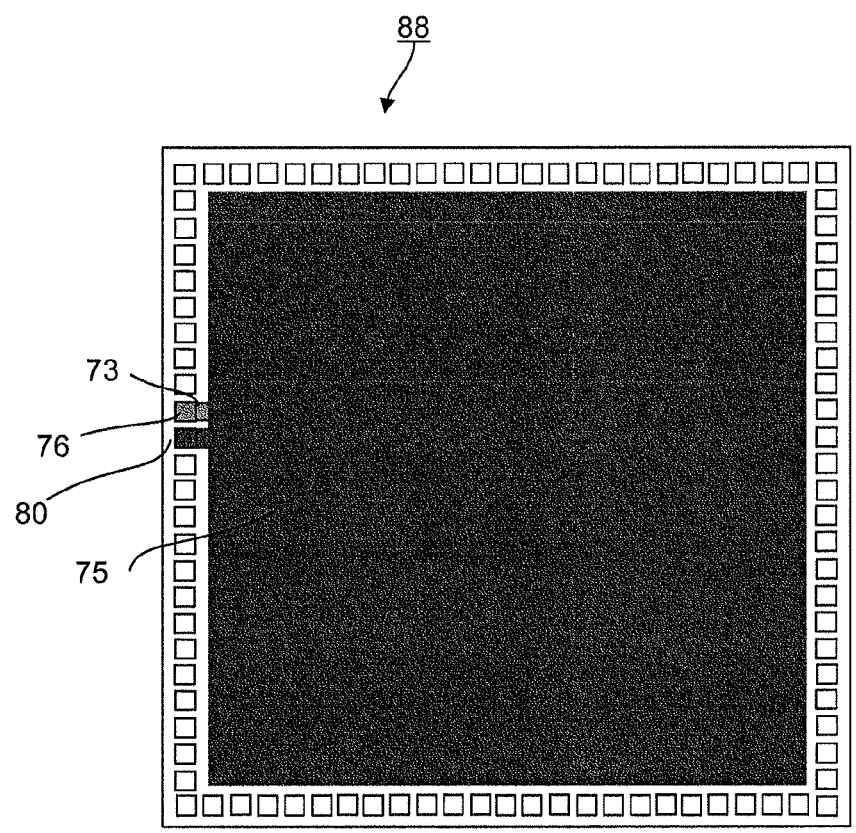
FIG. 14 illustrates the connection of a positive electrode and a negative electrode of the secondary battery-mounted integrated circuit chip.

FIG. 14 illustrates the connection state of the electrode pads of the secondary battery mounted on the integrated circuit with a negative electrode 73 and a positive electrode 75. The negative electrode 73 is connected to the electrode pad 76 for negative electrode and the positive electrode 75 is connected to the electrode pad 80 for positive electrode so as to supply power to other elements, as the external power supply. When the secondary battery is used as the internal power supply, the negative electrode and the positive electrode of the secondary battery are connected to the power supply wiring and the earth wiring inside the circuit via holes which are provided from the upper surface of the integrated circuit which has been subjected to passivation. In this case, a circuit for controlling the secondary battery may be provided at a part of the integrated circuit so that a charging current is supplied to the secondary battery when the output voltage of the secondary battery decreases to be lower than the threshold voltage, and current is supplied from the secondary battery when the power supply is shutdown.

Figure 15:
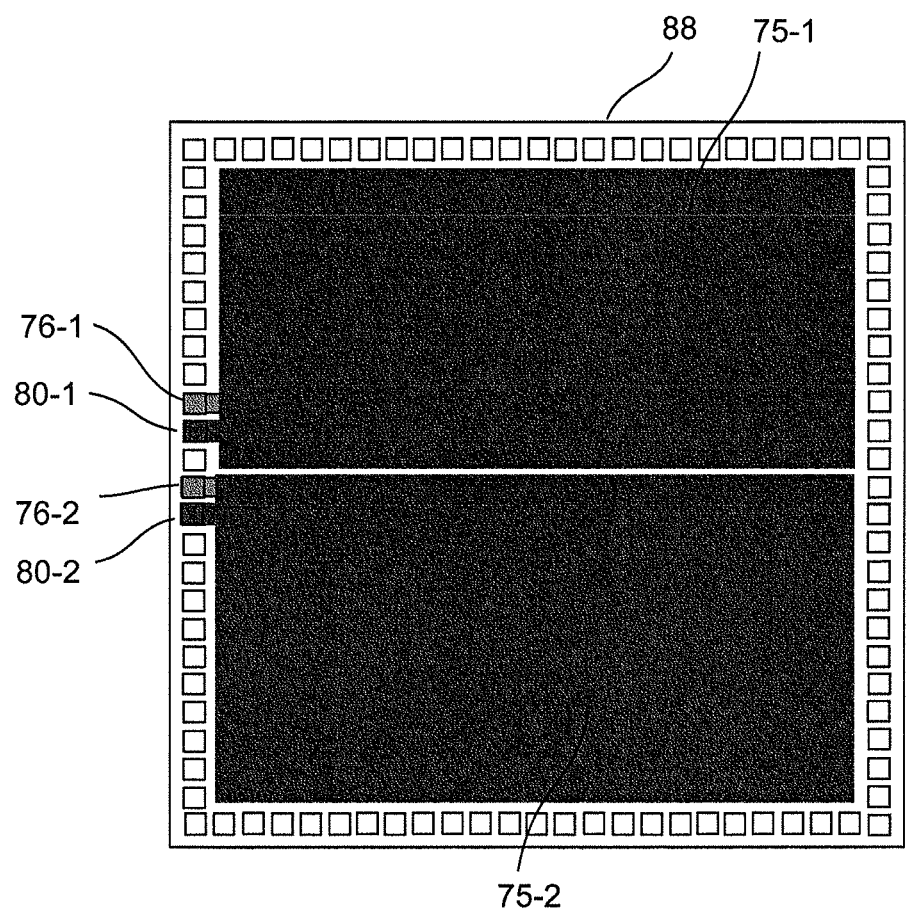
FIG. 15 is a view of a secondary battery divided into two parts.

In FIG. 15, the mounted secondary battery is divided into two secondary batteries. In FIG. 15, the positive electrode 75 in FIG. 14 is divided into positive electrode 75-1, 75-2 to thereby form the two secondary batteries. The divided secondary batteries are connected to respective electrode pads 76-1, 76-2 for negative electrode and respective electrode pads 80-1, 80-2 for positive electrode. The electrode pads 76-1, 76-2 for negative electrode may be made into one common electrode pad. Since the divided secondary batteries 88 are connected to the respective electrode pads, it is possible to connect the two secondary batteries in series by an external wiring, and to use one secondary battery and use the other secondary battery as backup, according to the purpose, thereby increasing the degree of freedom of design of device in mounting. As a matter of course, the serial connection also makes it possible to internally connect the divided secondary batteries within the mounting surface for use as the secondary battery with a double voltage, and to use them in other possible combinations.

Figure 16:
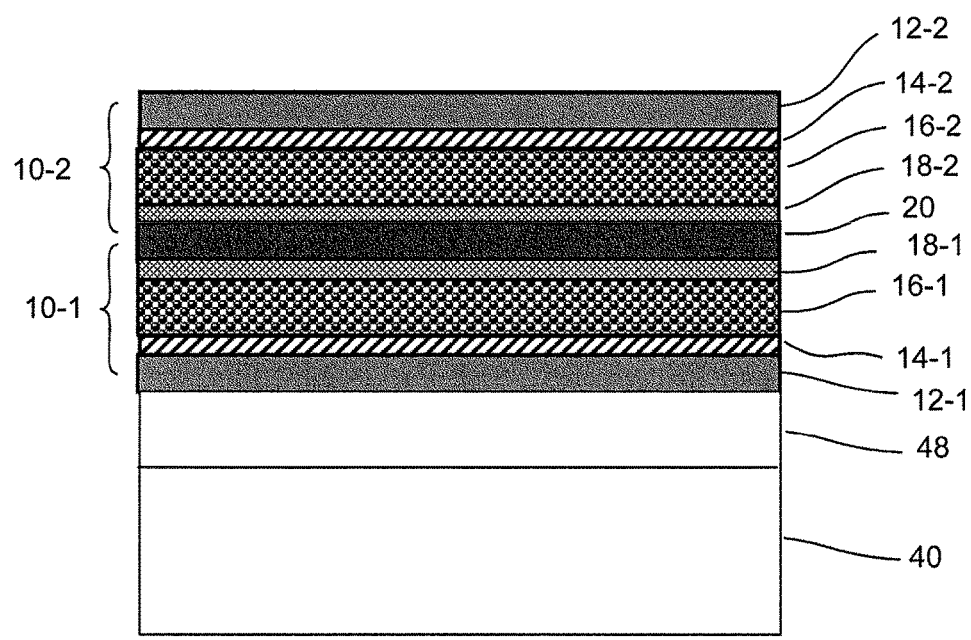
FIG. 16 is a view of a second secondary battery connected in parallel.

FIG. 16 is a cross-sectional view of a quantum battery 10-1 mounted on the integrated circuit and another quantum battery 10-2 stacked thereon. According to the flowchart 70 of the manufacturing method of the secondary battery-mounted circuit chip illustrated in FIG. 5, it is possible to further stack a secondary battery by the same technology, and the two quantum batteries 10-1, 10-2 are mounted in FIG. 16. In the secondary battery-mounted integrated circuit chip illustrated in FIG. 16, the two quantum batteries 10-1, 10-2 are symmetrically arranged so that the positive electrode 20 of the lower secondary battery is shared with the positive electrode of the upper secondary battery. The integrated circuit 48 is formed on the wafer 40, and a negative electrode 12-1, an n-type metal oxide semiconductor layer 14-1, a charge layer 16-1, a p-type metal oxide semiconductor layer 18-1, and the positive electrode 20 are stacked on the upper surface of the integrated circuit 48. The uppermost positive electrode also serves as the positive electrode of the quantum battery which is further stacked thereon. Therefore, a p-type metal oxide semiconductor layer 18-2, a charge layer 16-2, an n-type metal oxide semiconductor layer 14-2, and a negative electrode 12-2 are stacked on the positive electrode 20 in a reverse order this time. To the electrode pads, the negative electrodes 12-1, 12-2 are connected to the electrode pads for negative electrode, and the positive electrode 20 is connected to the electrode pad for positive electrode, so that the two stacked quantum batteries are formed in a parallel structure to double the capacity.

Figure 17:
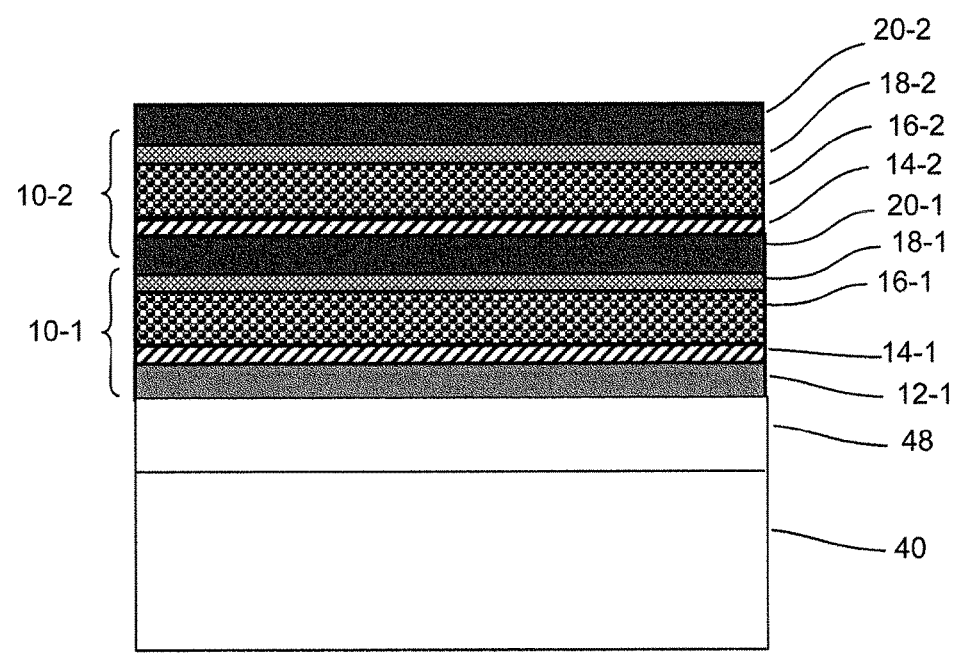
FIG. 17 is a view of a second secondary battery connected in series.
Figure 18:
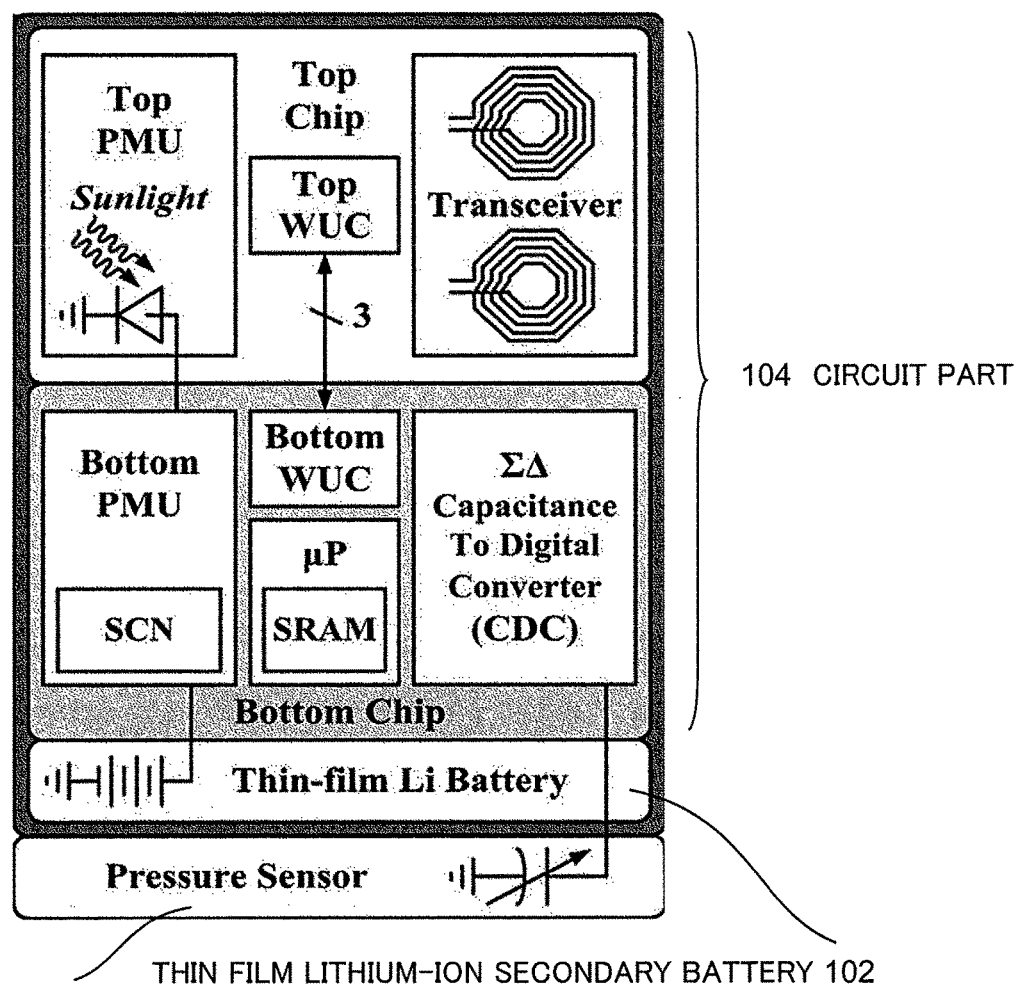
FIG. 18 is a view illustrating a conventional example.
Figure 19:
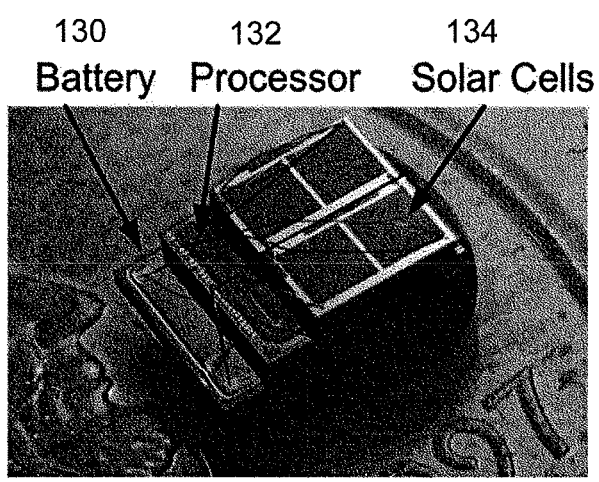
FIG. 19 is a view illustrating a conventional example.
Figure 20:
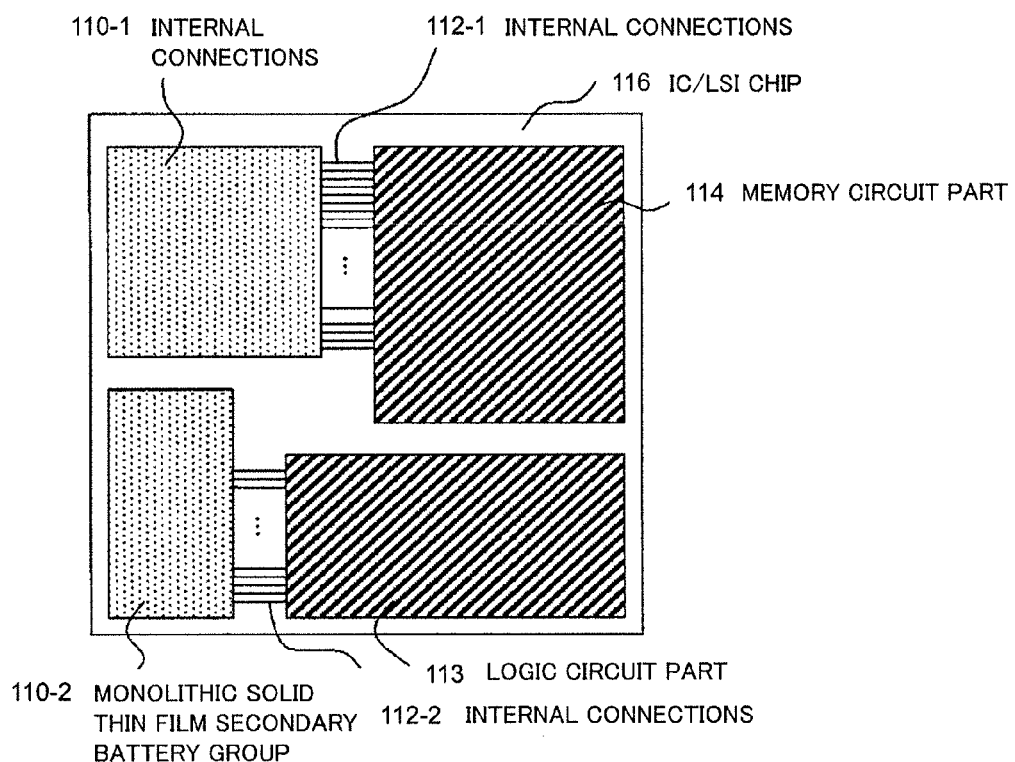
FIG. 20 is a view illustrating a conventional example.
Figure 21:
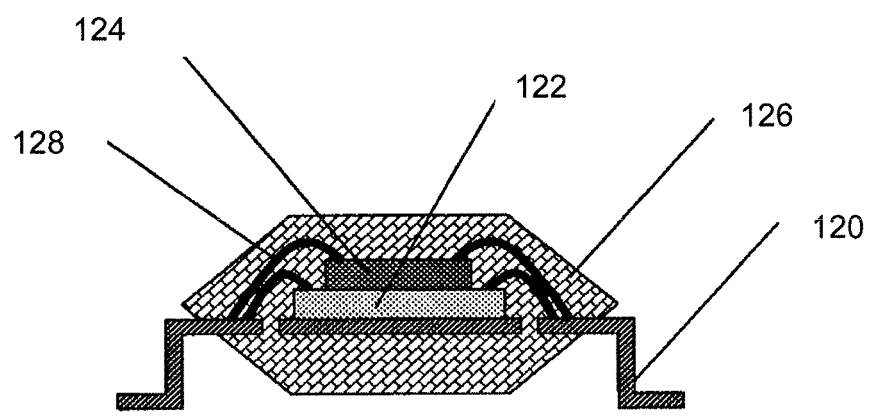
FIG. 21 is a view illustrating a conventional example.

FIG. 17 is a view in which the quantum batteries 10-1, 10-2 to be mounted are connected in series. In the serial connection, a positive electrode 20-1 of the lower quantum battery 10-1 also serve as the negative electrode of the quantum battery stacked thereon. Therefore, in the upper quantum battery 10-2, the n-type metal oxide semiconductor layer 14-2, the charge layer 16-2, the p-type metal oxide semiconductor layer 18-2, and a positive electrode 20-2 are stacked in this order.

Though FIG. 16 and FIG. 17 illustrate mounting examples of the two secondary batteries, as a matter of course, more secondary batteries can be stacked in multilayer. Further, it is possible to mount the secondary battery also on the rear surface of the wafer by the manufacturing method illustrated in the flowchart 70 of the manufacturing method of the secondary battery-mounted circuit chip illustrated in FIG. 5, thereby increasing the charging capacity as the secondary battery.

Examples

To fabricate the quantum battery as a parasitic structure, a silicon wafer having integrated circuits formed thereon was prepared. In the silicon wafer, a plurality of circuits such as memories and so on were formed, and a passivation layer was formed. First, to fabricate the lower electrode (negative electrode) by lift-off, a negative resist was applied on the entire wafer surface. After the application, the resist was baked.

The exposure of the photoresist was performed by a projection aligner apparatus, and development and baking were performed after the exposure. The negative resist was exposed and developed using a mask shielding a region excluding the electrode pads other than those to which the lower electrode was connected and the scribe region, thereby exposing a lower electrode region formation region. Note that the exposure conditions were adjusted so that the negative resist pattern was an inversely tapered shape.

Next, a film of aluminum as the negative electrode material was formed by the sputtering. As the apparatus therefor, an RF sputtering apparatus was used here. Then, the n-type metal oxide semiconductor to be stacked on the lower electrode was formed using titanium oxide as a material by the sputtering. After the film formation, the resist was removed using a solvent to be able to remove by lift-off the stacked film formed on the resist existing in a region other than the formation portion of the lower electrode (negative electrode) layer. This completed the lower electrode. The lower electrode layer was formed also on the pad where no resist existed, and was able to be connected to the integrated circuit through the pad.

Next, a mixed solution of titanium oxide and silicon oil was applied on the wafer by a spin coater, and burnt at 300° C. to 400° C.

Subsequently, a UV irradiation device was used to irradiate the wafer with ultraviolet rays to harden the silicon oil. Further, a nickel oxide film was formed by the sputtering process. The charge layer and the nickel oxide layer formed in the above processes were formed on the entire wafer surface, and therefore the charge layer and the nickel oxide layer in a region where no lower electrode existed was removed. More specifically, the positive resist was applied and baked, exposure was performed by the projection aligner is using a mask shielding a portion other than a charge layer removal portion, and development and baking were performed, and then etching was performed using a fluorine-based gas using a parallel-plate type etching apparatus. The resist after the etching was removed with a solvent. Note that to short circuit with the upper electrode, the region of the charge layer was made to be larger than the lower electrode by several μm.

Further, titanium dioxide was undergone structural changes on photoexcitation, and again the same irradiation with ultraviolet rays as above in order to form a new energy level.

Thereafter, the upper electrode (positive electrode) layer was formed by the lift-off process similarly using the negative resist. The upper electrode (positive electrode) layer was formed by the sputtering using the same aluminum as that of the lower electrode (negative electrode), as a material. The upper electrode (positive electrode) was formed at a region except the scribe region and the region of the pads other than that connected to each lower electrode (negative electrode).

The secondary battery stacked on the upper surface of the memory circuit of the wafer was thereby manufactured, and a pulse voltage was therefore applied between the positive electrode and the negative electrode to perform conditioning processing. The secondary battery subjected to the conditioning processing was confirmed to have sufficient charging function as a result of test.

Though the embodiments of the present invention have been described above, the present invention includes appropriate modifications without impairing its object and advantages and is not limited by the above embodiments.

EXPLANATION OF CODES 10, 10-1, 10-2 quantum battery
12 negative electrode
14 n-type metal oxide semiconductor layer
16 charge layer
18 p-type metal oxide semiconductor layer
20 positive electrode
40 wafer
42 integrated circuit chip
44 chip substrate
46 electrode pad
48 integrated circuit
52 gate electrode
54 first wiring layer
56 second wiring layer
58 third wiring layer
59 surface electrode layer
60, 60-1, 60-2, 60-3, 60-4 via hole
61-1, 61-2 via hole for positive electrode
62 electrode pad
63 surface electrode
64 scribe region
66 secondary battery mounting region
68 mounted secondary battery
70 flowchart illustrating a manufacturing method of a secondary battery-mounted circuit chip
72 photoresist
73 negative electrode
74 negative electrode layer
75 positive electrode
76, 76-1, 76-2 electrode pad for negative electrode
78 charge layer
80, 80-1, 80-2 electrode pad for positive electrode
81 negative electrode connection pad
82 positive electrode layer
83, 83-1, 83-2 insulating layer
84 dicing part
85 conductive paste
86 back grind part
87 positive electrode connection pad
88 secondary battery-mounted integrated circuit chip
89 package substrate
91 conductive paste

What is claimed is:

1. A secondary battery-mounted circuit chip comprising:
a substrate;
a circuit integrally formed on the substrate; and
a secondary battery formed in a region of the chip facing the circuit, the secondary battery being divided by only surface electrodes into a plurality of divided secondary batteries.

2. The secondary battery-mounted circuit chip according to claim 1, wherein
an uppermost part of the circuit includes multilayer wiring, and
the secondary battery is formed at the uppermost part of the circuit having the multilayer wiring.

3. The secondary battery-mounted circuit chip according to claim 1, wherein
a rear surface of the circuit includes multilayer wiring, and
the secondary battery is formed on the rear surface of the circuit having the multilayer wiring.

4. The secondary battery-mounted circuit chip according to claim 1, wherein
an uppermost part of the circuit and a rear surface of the circuit each includes multilayer wiring,
the secondary battery is formed at the uppermost part of the circuit having the multilayer wiring, and
the secondary battery is also formed on the rear surface of the circuit having the multilayer wiring.

5. The secondary battery-mounted circuit chip according to claim 1, wherein
the circuit includes
a wiring layer, and
a power supply layer wiring therein, and
the secondary battery includes at least one of a lower electrode and an upper electrode having a via hole therein through which the secondary battery is connected to the power supply layer wiring via the wiring layer.

6. The secondary battery-mounted circuit chip according to claim 1, further comprising a pad to which the secondary battery is connected and through which the secondary battery supplies power to another electric component when the chip is packaged with the another electric component.

7. The secondary battery-mounted circuit chip according to claim 1, wherein
the circuit includes a control circuit that controls the secondary battery and a via hole therein, and
the secondary battery includes electrodes connected to the control circuit via wiring that passes through the via hole.

8. The secondary battery-mounted circuit chip according to claim 1, further comprising a component composed of an electronic circuit, a logic circuit, a sensor, or MEMS.

9. The secondary battery-mounted circuit chip according to claim 1, wherein the circuit includes a passivation surface on which the secondary battery is directly fabricated.

10. The secondary battery-mounted circuit chip according to claim 1, wherein
the circuit includes multilayer wiring having an uppermost wiring layer,
at least a part of or the entire uppermost wiring layer of the multilayer wiring of the circuit is an electrode including a negative electrode or a positive electrode, and the electrode is a common electrode of the circuit and the secondary battery.

11. The secondary battery-mounted circuit chip according to claim 1, wherein
the circuit includes power supply wiring and a secondary battery control circuit, and
the secondary battery includes a lower electrode and an upper electrode connected to the power supply wiring or the secondary battery control circuit of the circuit chip via a connection outside of the circuit chip.

12. The secondary battery-mounted circuit chip according to claim 1, wherein
the substrate has a via hole therein,
the circuit includes power supply wiring and a secondary battery control circuit, and
the secondary battery comprises a lower electrode and an upper electrode connected to the power supply wiring or the secondary battery control circuit of the circuit through the via hole of the substrate.

13. The secondary battery-mounted circuit chip according to claim 1, wherein the secondary battery is a quantum battery.

14. The secondary battery-mounted circuit chip according to claim 1, wherein the plurality of divided secondary batteries are connected in series by an external wiring or an internal wiring.

15. The secondary battery-mounted circuit chip according to claim 1, wherein at least one of the plurality of divided secondary batteries is a backup power source.

* * * * *